United States Patent
Lim et al.

(10) Patent No.: US 11,016,143 B2
(45) Date of Patent: May 25, 2021

(54) APPARATUS AND METHOD OF TESTING A WIRING CIRCUIT

(71) Applicant: SAMSUNG ELECTRONICS CO., LTD., Suwon-si (KR)

(72) Inventors: Mee-hyun Lim, Seoul (KR); Sung-yeol Kim, Yongin-si (KR); Jae-hong Kim, Seoul (KR); Taek-jin Kim, Suwon-si (KR); Kyung-min Lee, Gwacheon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 26 days.

(21) Appl. No.: 16/426,112

(22) Filed: May 30, 2019

(65) Prior Publication Data

US 2020/0132758 A1 Apr. 30, 2020

(30) Foreign Application Priority Data

Oct. 29, 2018 (KR) .......................... 10-2018-0130240

(51) Int. Cl.
 *G01R 31/308* (2006.01)
(52) U.S. Cl.
 CPC .................................. *G01R 31/308* (2013.01)
(58) Field of Classification Search
 CPC ............................................ G01R 31/308–311
 See application file for complete search history.

(56) References Cited

U.S. PATENT DOCUMENTS

| 4,816,686 A * | 3/1989 | Hara ................. G01N 21/95684 |
| | | 250/458.1 |
| 5,535,006 A * | 7/1996 | Telschow ........... G01N 21/8806 |
| | | 250/559.01 |
| 5,585,735 A | 12/1996 | Takahashi et al. |
| 5,844,249 A * | 12/1998 | Takano ................ G01N 21/956 |
| | | 356/237.1 |

(Continued)

FOREIGN PATENT DOCUMENTS

| JP | 2002-310933 | 10/2002 |
| JP | 2003-124281 | 4/2003 |
| JP | 2005-017024 | 1/2005 |

*Primary Examiner* — Patrick Assouad
*Assistant Examiner* — Demetrius R Pretlow
(74) *Attorney, Agent, or Firm* — F. Chau & Associates, LLC

(57) ABSTRACT

An apparatus for testing a wiring circuit includes: a circuit substrate having wirings in the circuit substrate and pads on an upper surface of the circuit substrate and connected to the wirings; an electrode below a lower surface of the circuit substrate; an optical sensor above the upper surface of the circuit substrate and configured to detect a signal emitted from the upper surface of the circuit substrate; and an optical unit above the optical sensor and configured to irradiate light, wherein the optical sensor includes: an optical substrate whose optical characteristics are changed by the signal emitted from the upper surface of the circuit substrate; and a patterned reflective layer on a surface of the optical substrate facing the circuit substrate, the patterned reflective layer having a first region reflecting light incident on the optical substrate and a second region transmitting the light incident on the optical substrate.

18 Claims, 17 Drawing Sheets

(56) References Cited

U.S. PATENT DOCUMENTS

| | | | | |
|---|---|---|---|---|
| 6,141,093 A | * | 10/2000 | Argyle | G01N 21/21 324/523 |
| 6,815,973 B1 | * | 11/2004 | Conn | G01R 31/2884 324/750.3 |
| 6,894,514 B2 | | 5/2005 | Yanagisawa | |
| 8,378,708 B2 | | 2/2013 | Jun et al. | |
| 9,228,955 B2 | * | 1/2016 | Vignoud | G01N 21/783 |
| 2010/0170017 A1 | * | 7/2010 | Heidmann | G01R 33/032 850/48 |
| 2010/0177313 A1 | * | 7/2010 | Jun | G02F 1/1309 356/366 |
| 2011/0037077 A1 | * | 2/2011 | Ichimura | B01L 3/5027 257/84 |
| 2013/0082260 A1 | * | 4/2013 | Nakamura | H01L 25/072 257/48 |
| 2013/0207160 A1 | * | 8/2013 | Sasahata | H01L 31/1844 257/186 |
| 2014/0212023 A1 | * | 7/2014 | Fujii | G06T 7/0004 382/149 |
| 2014/0321497 A1 | * | 10/2014 | Matsumoto | G01R 31/71 374/1 |
| 2015/0355031 A1 | * | 12/2015 | Matsumoto | G01J 5/0896 219/121.66 |
| 2017/0199154 A1 | * | 7/2017 | Nakamura | G01R 33/032 |
| 2019/0088814 A1 | * | 3/2019 | Ueno | H01L 31/18 |
| 2019/0113565 A1 | | 4/2019 | Kim et al. | |
| 2019/0285706 A1 | * | 9/2019 | Sekelsky | G01R 33/26 |
| 2020/0194473 A1 | * | 6/2020 | Yokogawa | H01L 27/1463 |

\* cited by examiner

APPARATUS AND METHOD OF TESTING A WIRING CIRCUIT

CROSS-REFERENCE TO RELATED APPLICATION

This application claims priority under 35 U.S.C. § 119 to Korean Patent Application No. 10-2018-0130240, filed on Oct. 29, 2018, in the Korean Intellectual Property Office, the disclosure of which is incorporated by reference herein in its entirety.

TECHNICAL FIELD

The inventive concept relates to an apparatus and method of testing a wiring circuit, and more particularly, to an apparatus and method of testing the presence or absence of an abnormality in a circuit substrate.

DISCUSSION OF RELATED ART

Semiconductor products have various wirings in a circuit substrate for the conversion or transmission of an input signal. In a silicon circuit substrate, the wiring may be highly integrated and very complicated due to a minute line width. Semiconductor packaging technology is used to integrate systems at a package level by connecting different types of semiconductor chips to one semiconductor die. In the semiconductor packaging technology, a circuit substrate having several hundred thousand wirings may be used. However, conventional methods for detecting wiring abnormalities may not be effective due to the great number of wirings of circuit substrates and newly added processes.

SUMMARY

According to an exemplary embodiment of the inventive concept, there is provided an apparatus for testing a wiring circuit, the apparatus including: a circuit substrate having wirings formed in the circuit substrate and pads formed on an upper surface of the circuit substrate and connected to the wirings; an electrode located below a lower surface of the circuit substrate; an optical sensor located above the upper surface of the circuit substrate and configured to detect a signal emitted from the upper surface of the circuit substrate; and an optical unit located above the optical sensor and configured to irradiate light, wherein the optical sensor includes: an optical substrate whose optical characteristics are changed by the signal emitted from the upper surface of the circuit substrate; and a patterned reflective layer located on a surface of the optical substrate facing the circuit substrate, the patterned reflective layer having a first region for reflecting light incident on the optical substrate and a second region for transmitting the light incident on the optical substrate.

According to another exemplary embodiment of the inventive concept, there is provided an apparatus for testing a wiring circuit, the apparatus including: an electric signal generator configured to generate an electric signal for generating an electric field; a circuit substrate having an upper surface and a lower surface, the circuit substrate including wirings formed therein; a first electrode located on a first portion of the circuit substrate; a second electrode located on a second portion of the circuit substrate; an optical sensor configured to detect an electric field emitted from an upper surface of the circuit substrate; and an optical unit located on the optical sensor and configured to irradiate light, wherein the optical sensor includes: an optical substrate whose optical characteristics are changed by the electric field emitted from the upper surface of the circuit substrate; and a patterned reflective layer located on a surface of the optical substrate facing the circuit substrate, the patterned reflective layer having a first region for reflecting light incident on the optical substrate and a second region for transmitting the light incident on the optical substrate.

According to another exemplary embodiment of the inventive concept, there is provided a method of testing a wiring circuit, the method including: placing a circuit substrate between an electrode and an optical sensor, wherein the circuit substrate has wirings and pads connected to the wirings; operating the electrode to generate a signal in the circuit substrate; adjusting a position of the optical sensor by confirming a focus with an optical unit; irradiating light from the optical unit to the optical sensor to detect a signal image of the optical sensor and capturing an optical image of the circuit substrate; calculating resistance data of the wirings connected to the pads by matching the signal image with the optical image; and determining whether or not the wirings are abnormal, based on the resistance data.

According to an exemplary embodiment of the inventive concept, there is provided an apparatus for testing a wiring circuit, the apparatus including: a circuit substrate having wirings formed in the circuit substrate and pads formed on a first surface of the circuit substrate and connected to the wirings; an electrode spaced apart from a second surface of the circuit substrate and generating a first electric field towards the second surface of the circuit substrate; and an optical sensor spaced apart from the first surface of the circuit substrate and configured to detect a second electric field emitted from the first surface of the circuit substrate, wherein the optical sensor includes: an optical substrate; and a reflective layer disposed on the optical substrate and facing the circuit substrate, the reflective layer having a first region for reflecting light incident on the optical substrate and a second region for transmitting the light incident on the optical substrate.

BRIEF DESCRIPTION OF THE DRAWINGS

The above and other features of the inventive concept will be more clearly understood by describing in detail exemplary embodiments thereof with reference to the accompanying drawings in which.

DETAILED DESCRIPTION OF THE EMBODIMENTS

Hereinafter, exemplary embodiments of the inventive concept will be described in detail with reference to the accompanying drawings.

Figure 1:
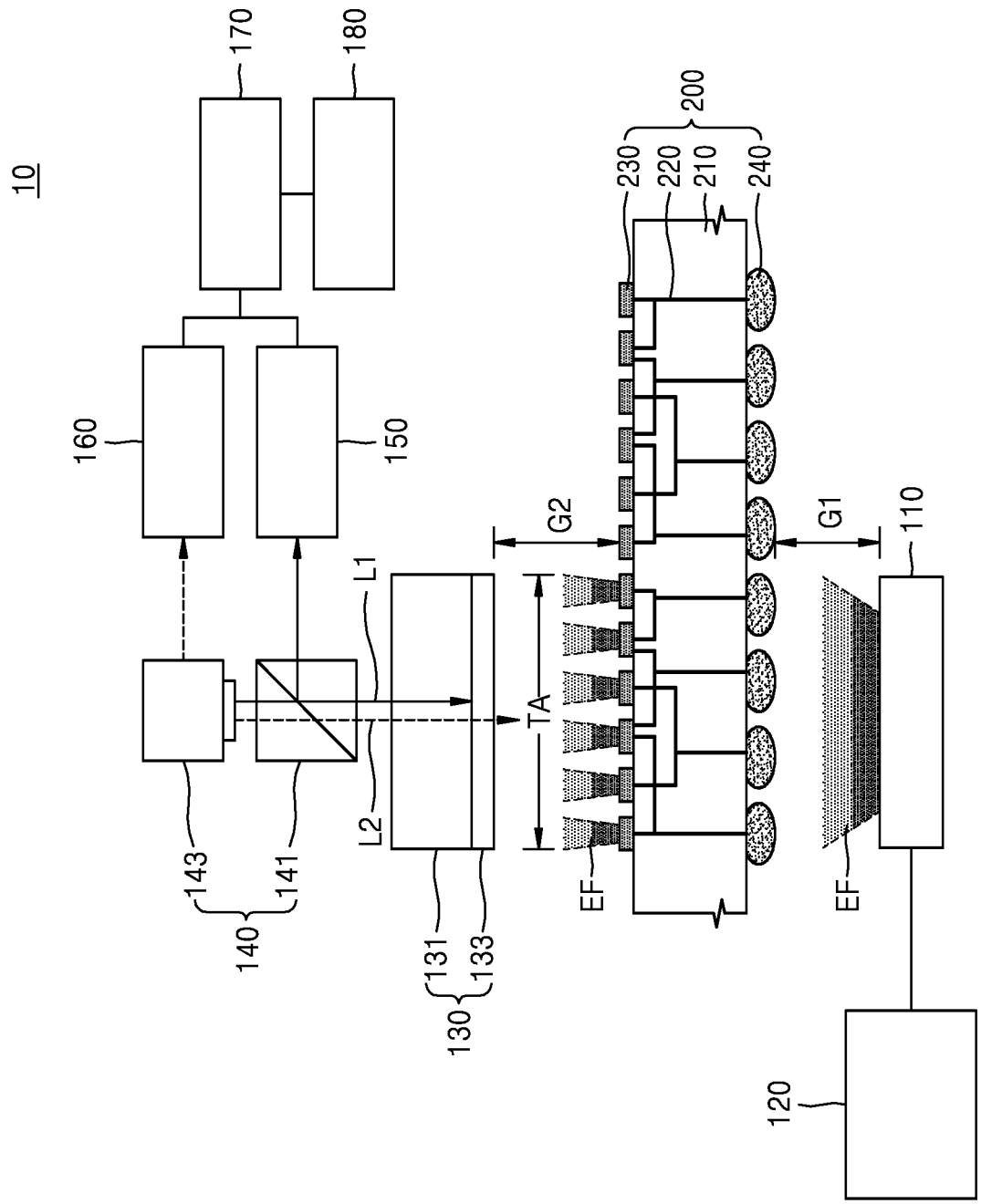
FIG. 1 is a diagram illustrating a wiring circuit test apparatus according to an exemplary embodiment of the inventive concept.

FIG. 1 is a diagram illustrating an apparatus 10 for testing a wiring circuit (hereinafter, referred to as a wiring circuit test apparatus), according to an exemplary embodiment of the inventive concept.

Referring to FIG. 1, the wiring circuit test apparatus 10 is an apparatus for testing the presence or absence of an abnormality in a wiring included in a circuit substrate 200 in a non-contact manner by using an electric field EF. The wiring circuit test apparatus 10 may include an electrode 110, an electric signal generator 120, an optical sensor 130, an optical unit 140, a signal processor 150, an image processor 160, a determination unit 170, and a controller 180.

The electrode 110 may be electrically connected to the electric signal generator 120 and may apply an electrical signal to the circuit substrate 200. The electrode 110 may include a metal having excellent electrical conductivity. For example, the electrode 110 may include copper (Cu), aluminum (Al), nickel (Ni), silver (Ag), gold (Au), platinum (Pt), or the like. In some exemplary embodiments of the inventive concept, the electrode 110 may include a transparent electrode including a transparent conductive material such as indium tin oxide (ITO), indium zinc oxide (IZO), zinc oxide (ZnO), antimony-doped tin oxide (ATO), or Al-doped zinc oxide (AZO).

The electrode 110 may be located under the circuit substrate 200. However, the position of the electrode 110 is not limited thereto. For example, the electrode 110 may be located at a side of the circuit substrate 200. Although the electric field EF generated by the electrode 110 is indicated by hatching for convenience of understanding, the actual form of the electric field EF may be different than what is illustrated.

The electrode 110 may have a flat plate shape. For example, the electrode 110 may have a flat plate shape corresponding to the circuit substrate 200. For example, the electrode 110 may have a flat plate shape corresponding to the lower surface of the circuit substrate 200. The flat plate shape may include a circular, elliptical, or polygonal flat plate shape.

In some exemplary embodiments of the inventive concept, the electrode 110 may have a rectangular flat plate shape. However, the shape of the electrode 110 is not limited thereto. In other exemplary embodiments of the inventive concept, the electrode 110 is not limited to a flat plate shape and may have any other shape corresponding to the circuit substrate 200.

The electrode 110 may be spaced apart from the circuit substrate 200. For example, the electrode 110 may be spaced apart from the lower surface of the circuit substrate 200 by a gap G1. In this case, the lower surface of the circuit substrate 200 may be the lowermost surfaces of connection terminals 240, and the upper surface of the circuit substrate 200 may be the uppermost surfaces of pads 230.

The influence of the electric field EF on the circuit substrate 200 may vary according to a size of the gap G1 and thus an electric field EF emitted from the circuit substrate 200 may also vary. Thus, the size of the gap G1 may be adjusted to control the magnitude of the electric field EF emitted from the circuit substrate 200 and to distinguish an electric field EF by position. For example, as the size of the gap G1 is reduced, the electric field EF may increase.

The electric signal generator 120 may generate an electric signal for electric field generation. For example, the electric signal generator 120 may generate an electric signal and apply the generated electric signal to the circuit substrate 200 through the electrode 110, and thus, the electric field EF may be generated.

The electric signal generator 120 may include an oscillator, a phase locked loop (PLL) circuit, a digital to analog converter (DAC), and/or the like and may generate a radio frequency (RF) signal as an electric signal. For example, the electric signal generator 120 may generate an RF signal of several tens of MHz to several tens of GHz as an electric signal. The frequency range of the electric signal generated by the electric signal generator 120 is not limited thereto. In some exemplary embodiments of the inventive concept, the electric signal generator 120 may be integrated with the electrode 110.

The optical sensor 130 may detect the electric field EF emitted from the circuit substrate 200. In some exemplary embodiments of the inventive concept, the optical sensor 130 may include a sensor using electro-optic crystals. However, the type of the optical sensor 130 is not limited thereto. For example, all types of optical sensors capable of effectively detecting the electric field EF may be applied to the wiring circuit test apparatus 10.

The detection of the electric field EF by the optical sensor 130 may correspond to detecting a signal providing information on electric field intensity rather than direct detection of the electric field intensity. For example, the optical sensor 130 may detect an electric signal or an optical signal, and the detected electric signal or optical signal may include information on electric field intensity.

The optical sensor 130 may detect an electric field EF of the entirety of a test area TA of the circuit substrate 200 at one time or detect an electric field EF of a portion of the test area TA. For example, when the optical sensor 130 detects an electric field EF of a portion of the test area TA, the optical sensor 130 may detect an electric field EF of the entirety of the test area TA by moving the optical sensor 130 so that electric fields EF of remaining portions of the test area TA are detected.

The optical sensor 130 may include an optical substrate 131 and a patterned reflective layer 133. The optical substrate 131 may include the patterned reflective layer 133 on the lower surface thereof and may reflect a portion (e.g., light L1) of lights L1 and L2 incident on the patterned reflective layer 133. The refractive index of the optical substrate 131 or the crystallographic direction of the optical substrate 131 may be changed according to the intensity of the electric field EF, and the reflection characteristic of the light L1 may be changed according to the intensity of the electric field EF. Although the light L1 and the light L2 are shown separately for convenience of understanding, light that is actually irradiated on the optical sensor 130 may be a single light.

The patterned reflective layer 133 may be formed on one surface of the optical substrate 131 facing the circuit substrate 200. The patterned reflective layer 133 may include a first region 133A (see FIG. 3B) for reflecting a portion (e.g., the light L1) of the lights L1 and L2 incident on the optical sensor 130 and a second region 133B (see FIG. 3B) for transmitting the other portion (e.g., the light L2) of the lights L1 and L2. The first region 133A may be formed by a reflection coating treatment for visible light, and the second region 133B may be formed by a transmission coating treatment for visible light and/or a reflection coating treatment for an electric field. However, the type of the coating treatment is not limited thereto.

In some exemplary embodiments of the inventive concept, the patterned reflective layer 133 may have a stripe pattern formed by the first and second regions 133A and 133B, or may have a mesh pattern formed by the first and second regions 133A and 133B. However, the patterned reflective layer 133 is not limited thereto. The patterned reflective layer 133 is described below in detail.

The optical unit 140 may include an optical device 141 and a light source device 143. The optical device 141 may transmit or reflect the lights L1 and L2 generated by the light source device 143 and cause the lights L and L2 to enter the optical sensor 130. Alternatively, the optical device 141 may reflect or transmit the light L1 reflected from the optical sensor 130 and cause the light L1 to enter the signal processor 150.

The optical device 141 may widely spread the lights L1 and L2 to irradiate the lights L1 and L2 onto the entirety of the optical sensor 130 corresponding to the test area TA of the circuit substrate 200. When the test area TA of the circuit substrate 200 is wide, the lights L1 and L2 may not be irradiated onto the entirety of the optical sensor 130 at one time; therefore, the lights L1 and L2 may be irradiated onto the optical sensor 130 a plurality of times.

The light source device 143 may generate the lights L1 and L2 and cause the generated lights L1 and L2 to enter the optical device 141. The light source device 143 may include a function of capturing an optical image. For example, the light source device 143 may include an image pickup unit. The image pickup unit may be integrated with the light source device 143 or be adjacent to the light source device 143. In some exemplary embodiments of the inventive concept, the light source device 143 may be integrated with the optical device 141.

The signal processor 150 may calculate the electric field intensity of the circuit substrate 200 and the resistance of a wiring 220 of the circuit substrate 200, based on a signal image detected by the optical sensor 130. For example, when the test area TA is an area where the pads 230 on the upper surface of the circuit substrate 200 are located, the signal processor 150 may calculate the electric field intensity of each of the pads 230 and the resistance of a wiring 220 corresponding thereto.

The signal processor 150 may filter a signal input from the optical sensor 130 and obtain a noise-canceled signal image. In addition, the signal processor 150 may apply a mathematical operation to a signal image and calculate the electrical field intensity and resistance of each of the pads 230 of the circuit substrate 200.

The image processor 160 may accurately determine the shape and position of each of the pads 230 of the circuit substrate 200 based on an optical image captured by the light source device 143. For example, when the test area TA is an area where the pads 230 on the upper surface of the circuit substrate 200 are located, the image processor 160 may determine the shape and position of each of the pads 230 and calculate coordinates corresponding thereto.

The determination unit 170 may determine whether or not the wiring 220 of the circuit substrate 200 is abnormal. The determination unit 170 may determine whether or not the wiring 220 is abnormal, based on design data of the circuit substrate 200, electric field intensity and resistance calculated by the signal processor 150, and the like. In addition, the determination unit 170 may accurately determine the position of the wiring 220 based on the design data of the circuit substrate 200, the coordinates of the pad 230 calculated by the image processor 160, and the like. The signal image and the optical image may be acquired simultaneously or sequentially in the optical unit 140, and the determination unit 170 may match a signal image analyzed in the signal processor 150 with an optical image analyzed in the image processor 160 and determine whether or not the wiring 220 is abnormal for each of the pads 230.

The controller 180 may control and adjust a focus to obtain an accurate signal image and an accurate optical image. For example, the controller 180 may adjust a gap G2 between the optical sensor 130 and the circuit substrate 200 and a tilt angle of the optical sensor 130. In other words, the controller 180 may adjust the position and angle of the optical sensor 130 to obtain an accurate signal image and an accurate optical image by adjusting the focuses of the optical sensor 130 and the circuit substrate 200 via the optical unit 140.

An object (e.g., a sample) to be tested by the wiring circuit test apparatus 10 may be the circuit substrate 200. The circuit substrate 200 may include a substrate 210, the wiring 220, the pads 230, and the connection terminals 240.

The substrate 210 may include, for example, any one selected from silicon, organic material, plastic, and glass substrate. However, the material of the substrate 210 is not limited thereto. The substrate 210 may have a single layer or multi-layer structure. When the substrate 210 is a silicon substrate, the circuit substrate 200 may be a silicon interposer. When the substrate 210 is an organic substrate, the circuit substrate 200 may be a panel interposer.

The wiring 220 may have a single layer or multi-layer wiring structure depending on the structure of the substrate 210. For example, the wiring 220 may include a lower pad, a through electrode, and a wiring layer. The through electrode may penetrate at least a portion of the substrate 210 to connect the lower pad to the wiring layer. When the substrate 210 is a silicon substrate, the through electrode may be a through silicon via (TSV). When the wiring layer includes a plurality of layers, the plurality of layers, which are different layers, may be connected through vertical contacts. The wiring layer may be covered with an interlayer insulating layer, and the lower pad may be covered with a lower insulating layer.

The pads 230 may be arranged on the upper surface of the substrate 210 and may be electrically connected to the wiring 220. The pads 230 may be referred to as top pads. In a semiconductor product, semiconductor chips such as a memory chip or a logic chip may be electrically connected to the pads 230 through bumps and stacked on the pads 230.

The connection terminals 240 may be arranged on the lower surface of the substrate 210 and may be electrically connected to the wiring 220. The connection terminals 240 may be used to stack the circuit substrate 200 on a package substrate such as a printed circuit board (PCB). The connection terminals 240 may be bumps or solder balls. Each of the connection terminals 240 may be connected to one of the pads 230. For example, the connection terminals 240 may be connected to the pads 230 through the wiring 220. The number of pads 230 may be greater than the number of connection terminals 240 because the pads 230 used for power or ground may be integrally connected to the connection terminals 240.

Although a non-contact type test will be mainly described for the wiring circuit test apparatus 10, a contact type test is not excluded. For example, the electric field EF may be generated even when the electrode 110 directly contacts the connection terminals 240, and thus, the circuit substrate 200 may be tested in a contact manner.

In addition, although the circuit substrate 200 is described as an object (e.g., a sample) to be tested, the object to be tested is not limited to the circuit substrate 200. For example, all types of samples in which wirings and/or rewiring are present and pads and/or connection terminals are arranged on at least one of the upper and lower surfaces of each of the samples may be objects to be tested by the wiring circuit test apparatus 10. Thus, the wiring circuit test apparatus 10 may be used for a wafer test facility, a package test facility, and a failure analysis facility.

Unlike the wiring circuit test apparatus 10 according to the present embodiment of the inventive concept, a general wiring circuit test apparatus may have the following structure and/or functionality.

First, in the general wiring circuit test apparatus, a front reflective layer that uniformly reflects all light is formed in an optical sensor. The front reflective layer effectively reflects light, but light is not transmitted toward a circuit substrate generating an electric field, and thus, an optical image of the circuit substrate may not be properly obtained. Particularly, in the measuring of a circuit substrate including a great number of wirings, an optical image is used for matching the position of a pad with an electric field. Thus, since the optical image of the circuit substrate has to be measured in a state in which the optical sensor is removed before or after a signal image is measured through the optical sensor, precise measurement may not be obtained and measurement time may increase.

Second, the general wiring circuit test apparatus includes an identification marker for focusing to accurately measure a large-area signal image. Thus, the size of the signal image may be reduced to secure an area where the identification marker is located. In addition, since a focus error may occur at a position far from the identification marker and it is necessary to repeatedly adjust a focus, precise measurement may not be obtained and measurement time may increase.

Third, the general wiring circuit test apparatus includes a position sensor for adjusting a gap between the circuit substrate and the optical sensor, or repeated measurement is required for accurate gap measurement. In the case of a circuit substrate including fine pads each having a pad width of micrometer size, a gap between the circuit substrate and the optical sensor has to be maintained at a level of several tens of micrometers or less to enable accurate electric field measurement. When the gap increases to several tens of micrometers or more, most of the electric field generated in the circuit substrate is dispersed, and thus, the electric field may not be accurately measured due to a decrease in resolution and sensitivity. Thus, since it is necessary to use a position sensor so as not to interfere with the measurement of the electric field or to find an optimum distance between the circuit substrate and the optical sensor through repetitive measurement, precise measurement may not be obtained and measurement time may increase.

Unlike the general wiring circuit test apparatus, since the optical sensor 130 of the wiring circuit test apparatus 10 according to the present embodiment of the inventive concept includes the patterned reflective layer 133 including the first region 133A for reflecting the light L1 and the second region 133B for transmitting the light L2, a signal image may be obtained using the light L1 reflected from the first region 133A and an optical image may be obtained using the light L2 incident on the circuit substrate 200 through the second region 133B. Thus, since the signal and optical images may be measured through only the focus adjustment of the optical unit 140 without an identification marker, the matching between the position of the pad 230 in the circuit substrate 200 and a signal may be easily performed using a single light. In addition, the gap G2 and the angle between the circuit substrate 200 and the optical sensor 130 may be adjusted through only the focus adjustment of the optical unit 140 without a position sensor.

Therefore, the wiring circuit test apparatus 10 according to the present embodiment of the inventive concept may use the optical unit 140, which enables precise position measurement and has a wide field of view (FOV), and may measure a great number of wirings 220 at one time in a non-contact manner. Therefore, the wiring circuit test apparatus 10 may quickly determine whether there is an abnormality in the wirings 220 without damaging the circuit substrate 200.

Figure 2:
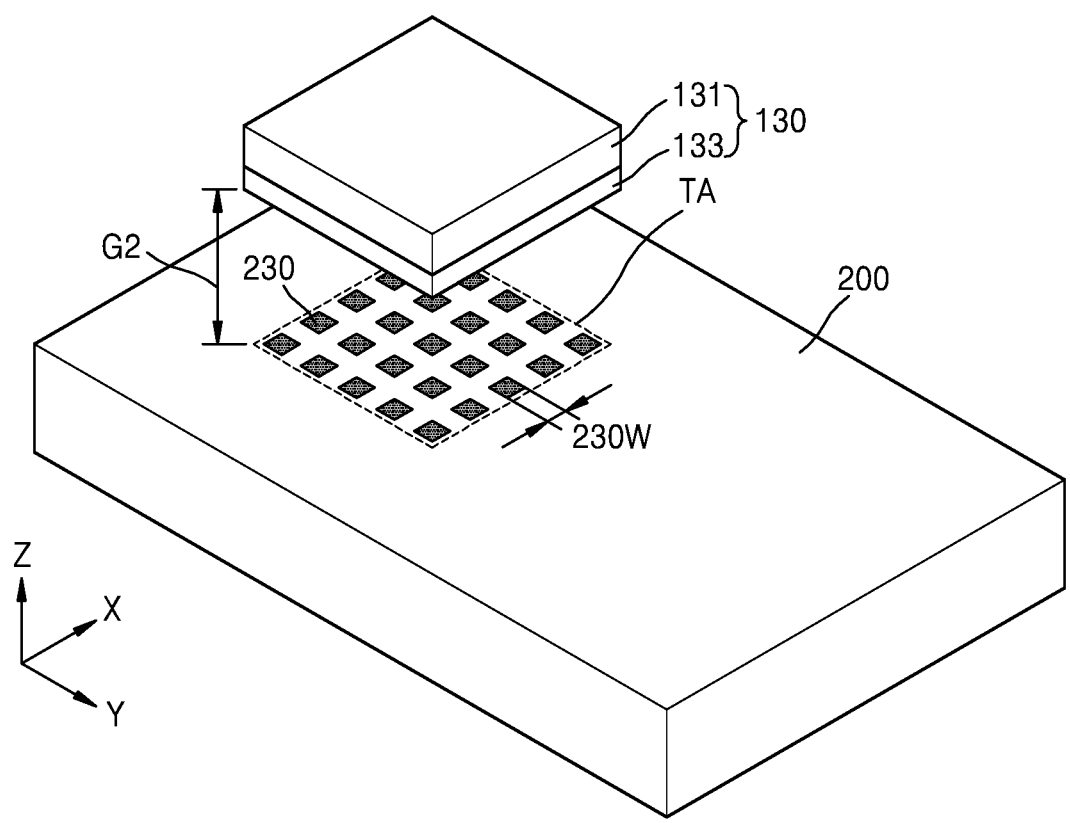
FIG. 2 is a perspective view illustrating the relationship between a circuit substrate and an optical sensor in the wiring circuit test apparatus of FIG. 1.

FIG. 2 is a perspective view illustrating the relationship between the circuit substrate 200 and the optical sensor 130 in the wiring circuit test apparatus 10 of FIG. 1.

Referring to FIG. 2, in the wiring circuit test apparatus 10 (see FIG. 1), the optical sensor 130 may have a flat plate shape corresponding to the test area TA of the circuit substrate 200 and may be spaced apart from the circuit substrate 200.

For example, when the test area TA of the circuit substrate 200 has a rectangular shape, the optical sensor 130 may have a rectangular flat plate shape. The optical sensor 130 may include the optical substrate 131 and the patterned reflective layer 133 and may have a rectangular flat plate shape.

The area of the optical sensor 130 may be greater than the area of the test area TA. Accordingly, the optical sensor 130 may entirely cover the test area TA and may detect the electric field EF (see FIG. 1) of the entirety of the test area TA of the circuit substrate 200 at one time.

In other exemplary embodiments of the inventive concept, the area of the optical sensor 130 may be less than the area of the test area TA. Accordingly, the optical sensor 130 may cover only a portion of the test area TA and may detect the electric field EF of the entirety of the test area TA of the circuit substrate 200 by moving the optical sensor 130.

The controller 180 (see FIG. 1) may adjust the gap G2 between the optical sensor 130 and the circuit substrate 200 and the tilt angle of the optical sensor 130. In other words, the controller 180 may adjust the position of the optical sensor 130 to obtain an accurate signal image and an accurate optical image by adjusting a focus between the optical sensor 130 and the circuit substrate 200 via the optical unit 140 (see FIG. 1).

In addition, the influence of the electric field EF on the optical sensor 130 may vary according to the size of the gap G2. Thus, the size of the gap G2 may be adjusted to control the magnitude of the electric field EF emitted from the circuit substrate 200 and to distinguish an electric field EF by position. For example, as the size of the gap G2 is reduced, the sensitivity of the electric field EF detected by the optical sensor 130 may increase.

Figure 3A:
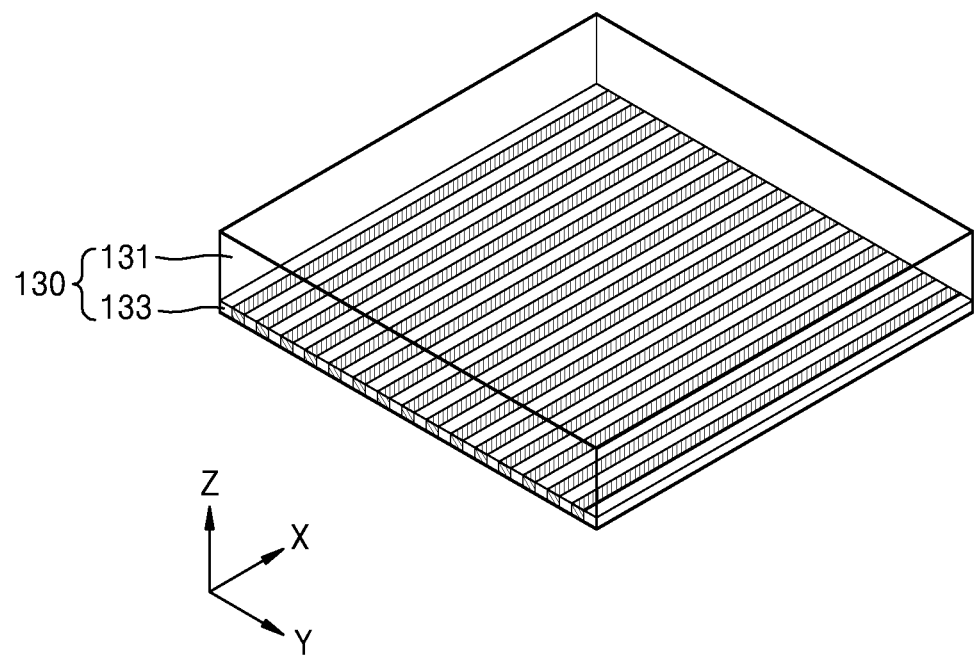
FIGS. 3A and 3B are respectively a perspective view and a plan view of an optical sensor in the wiring circuit test apparatus of FIG. 1, according to an exemplary embodiment of the inventive concept.
Figure 3B:
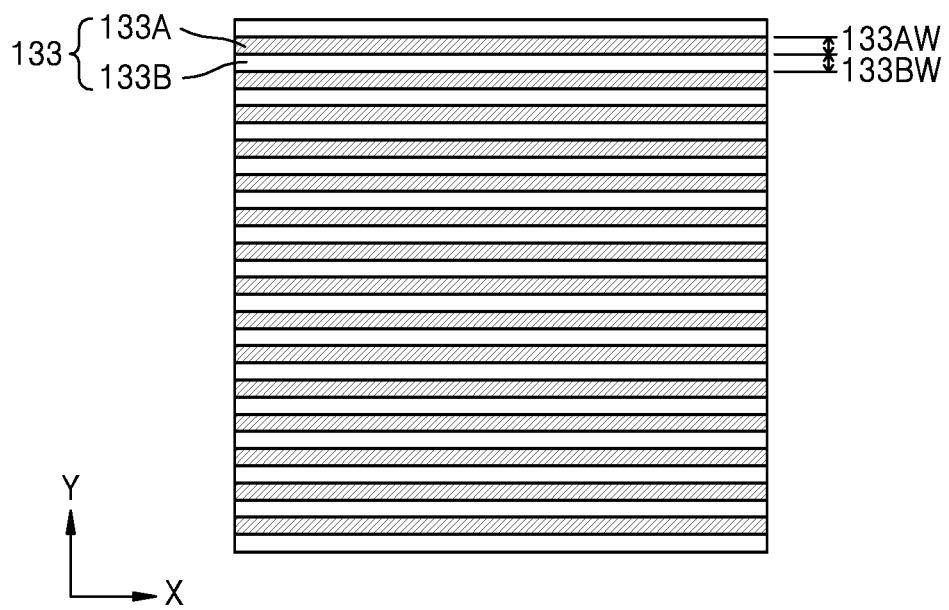

FIGS. 3A and 3B are respectively a perspective view and a plan view of an optical sensor 130 in the wiring circuit test apparatus 10 of FIG. 1, according to an exemplary embodiment of the inventive concept.

Referring to FIGS. 3A and 3B, the optical sensor 130 includes an optical substrate 131 whose optical characteristics are changed by a signal, and a patterned reflective layer 133 formed on one surface of the optical substrate 131 facing the circuit substrate 200 (see FIG. 1). The patterned reflective layer 133 has a first region 133A for reflecting light incident on the optical substrate 131 and a second region 133B for transmitting light incident on the optical substrate 131.

The patterned reflective layer 133 includes the first region 133A having a reflection coating treatment for visible light and the second region 133B having a transmission coating treatment for visible light and/or a reflection coating treatment for an electric field. The patterned reflective layer 133 may have a stripe pattern. In other words, the first region 133A may include a plurality of first lines extending in a first direction X and spaced apart from each other in a second direction Y, the second region 133B may include a plurality of second lines extending in the first direction X and spaced apart from each other in the second direction Y, and the first line and the second line may be alternately repeated in the second direction Y to form the patterned reflective layer 133.

In some exemplary embodiments of the inventive concept, the first region 133A may include a plurality of first lines extending in the second direction Y and spaced apart from each other in the first direction X, the second region 133B may include a plurality of second lines extending in the second direction Y and spaced apart from each other in the first direction X, and the first line and the second line may be alternately repeated in the first direction X to form the patterned reflective layer 133.

In other exemplary embodiments of the inventive concept, the first region 133A may include a plurality of first lines extending in a diagonal direction and spaced apart from each other, the second region 133B may include a plurality of second lines extending in the diagonal direction and spaced apart from each other, and the first line and the second line may be alternately repeated to form the patterned reflective layer 133.

A first width 133AW of the first region 133A in the second direction Y may be substantially equal to a second width 133BW of the second region 133B in the second direction Y. However, the first and second widths 133AW and 133BW are not limited thereto. In addition, the first and second widths 133AW and 133BW may be less than a pad width 230W (see FIG. 2). When the first and second widths 133AW and 133BW are greater than the pad width 230W, a signal image or an optical image may not be properly obtained in some pads 230 (see FIG. 2).

Figure 4A:
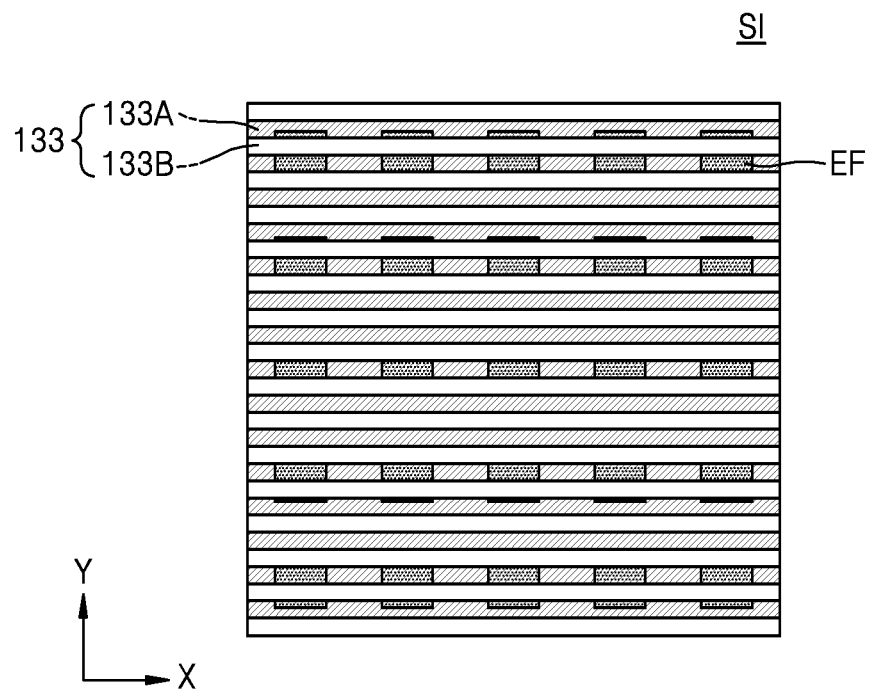
FIGS. 4A and 4B are respectively a signal image and an optical image, measured using the optical sensor of FIGS. 3A and 3B.

FIGS. 4A and 4l are respectively a signal image and an optical image, measured using the optical sensor 130 of FIGS. 3A and 3B.

Figure 4B:
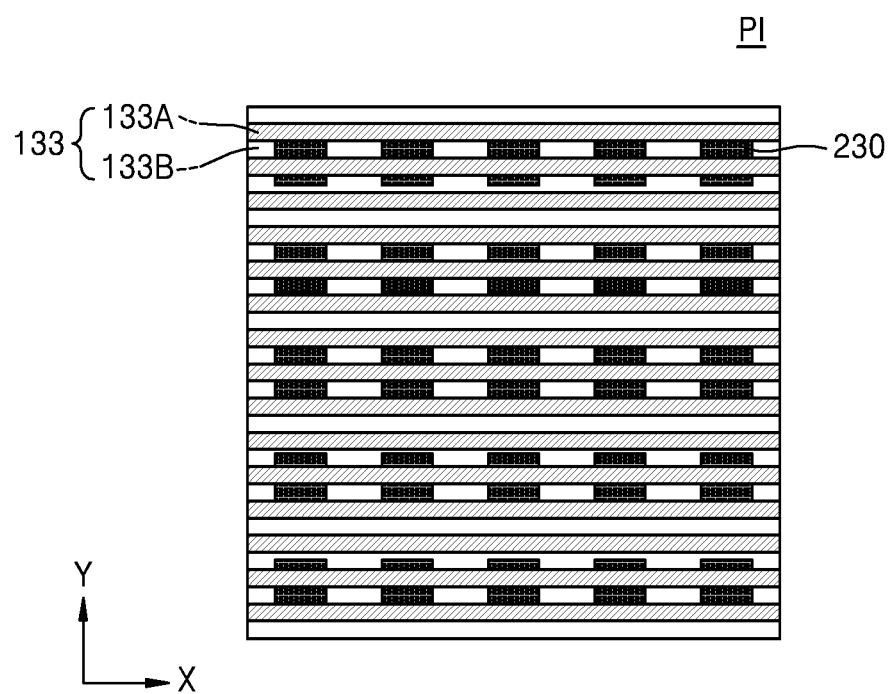

FIG. 4A illustrates a signal image SI of the circuit substrate 200 (see FIG. 2), detected using light reflected from the first region 133A of the patterned reflective layer 133. FIG. 4B illustrates an optical image PI of the circuit substrate 200, captured using light reflected from the circuit substrate 200 after passing through the second region 133B of the patterned reflective layer 133.

The electric field intensity and resistance of each of the pads 230 may be calculated using the signal image SI of FIG. 4A. The shape and position of each of the pads 230 may be determined using the optical image PI of FIG. 4B and coordinates corresponding thereto may be calculated. Since the signal image SI and the optical image PI may be measured through only focus adjustment with a single light generated by the optical unit 140 (see FIG. 1), which is a single optical unit, the matching between position data and signal data of the pad 230 may be easily processed. The signal image SI represents an optical signal corresponding to an electric field EF emitted from the pad 230 and the optical image PI represents the shape of the pad 230.

The signal image SI and the optical image PI may be obtained without a separate position sensor through focal position confirmation. Keeping the gap G2 (see FIG. 1) between the circuit substrate 200 and the optical sensor 130 (see FIG. 1) as small and uniform as possible by using the optical unit 140, which is capable of fine focus adjustment, can lead to enhanced resolution of images and increased test accuracy of the wirings 220 (see FIG. 1).

Figure 5A:
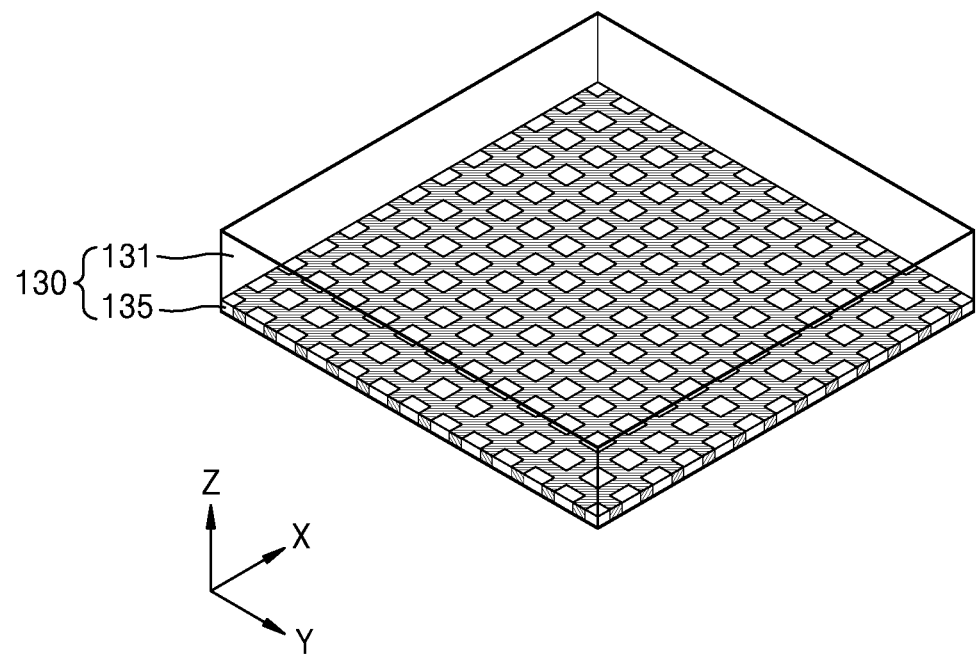
FIGS. 5A and 5B are respectively a perspective view and a plan view of an optical sensor in the wiring circuit test apparatus of FIG. 1, according to another exemplary embodiment of the inventive concept.
Figure 5B:
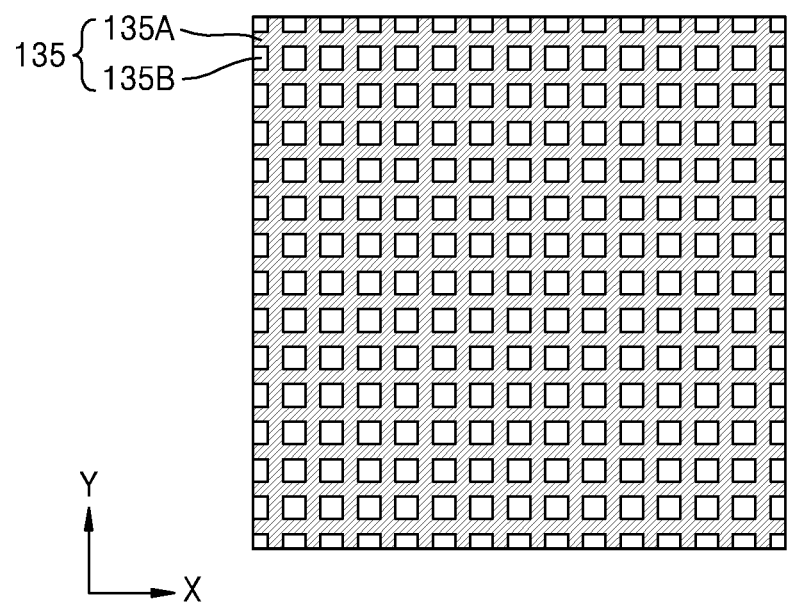

FIGS. 5A and 5B are respectively a perspective view and a plan view of an optical sensor 130 in the wiring circuit test apparatus 10 of FIG. 1, according to another exemplary embodiment of the inventive concept.

Referring to FIGS. 5A and 5B, the optical sensor 130 includes an optical substrate 131 whose optical characteristics are changed by a signal, and a patterned reflective layer 135 formed on one surface of the optical substrate 131 facing the circuit substrate 200 (see FIG. 1). The patterned reflective layer 135 has a first region 135A for reflecting light incident on the optical substrate 131 and a second region 135B for transmitting light incident on the optical substrate 131.

The patterned reflective layer 135 includes the first region 135A having a reflection coating treatment and the second region 135B having a transmission coating treatment. It is to be understood that the second region 135B may not have a reflection coating treatment. The patterned reflective layer 135 may have a mesh pattern. In other words, to form the patterned reflective layer 135, the first region 135A may be arranged to cross the first direction X and the second direction Y which are orthogonal to each other and the second region 135B may be arranged in a dot pattern in an area where the first region 135A is not formed.

In some exemplary embodiments of the inventive concept, to form the patterned reflective layer 135, the second region 135B may be arranged to cross the first direction X and the second direction Y which are orthogonal to each other and the first region 135A may be arranged in a dot pattern in an area where the second region 135B is not formed.

In other exemplary embodiments of the inventive concept, to form the patterned reflective layer 135, the first region 135A may be arranged in a diagonal direction and the second region 135B may be arranged in a rhombic pattern in an area where the first region 135A is not formed.

The patterned reflective layer 135 may be formed such that each of the pads 230 (see FIG. 2) overlaps both the first region 135A and the second region 135B. When each of the pads 230 does not overlap both the first region 135A and the second region 135B, a signal image and an optical image may not be properly obtained in some pads 230.

Figure 6A:
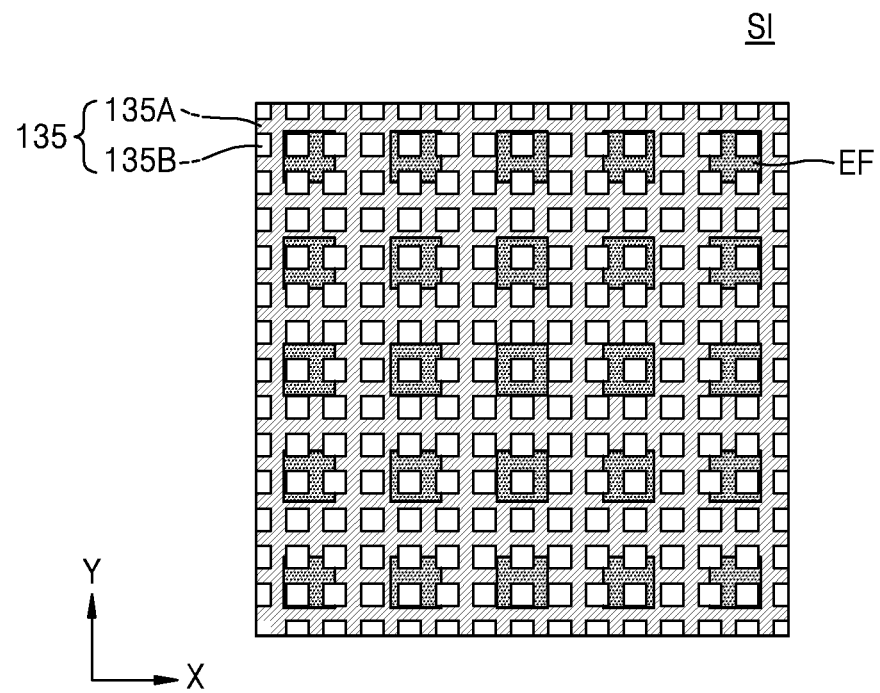
FIGS. 6A and 6B are respectively a signal image and an optical image, measured using the optical sensor of FIGS. 5A and 5B.
Figure 6B:
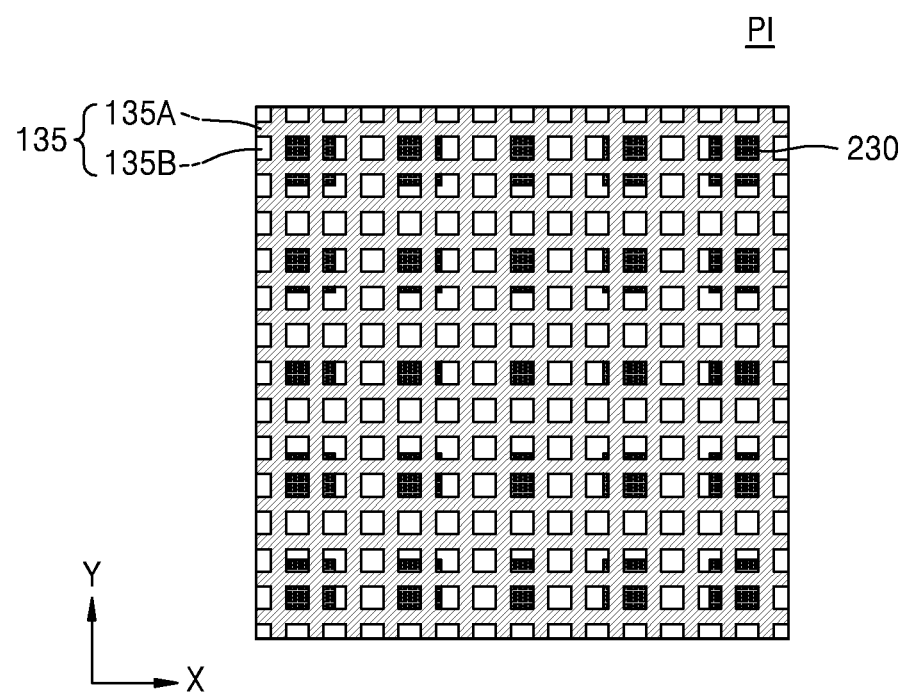

FIGS. 6A and 6B are respectively a signal image and an optical image, measured using the optical sensor 130 of FIGS. 5A and 5B.

FIG. 6A illustrates a signal image SI of the circuit substrate 200 (see FIG. 2), detected using light reflected from the first region 135A of the patterned reflective layer 135. FIG. 6B illustrates an optical image PI of the circuit substrate 200, captured using light reflected from the circuit substrate 200 after passing through the second region 135B of the patterned reflective layer 135.

The electric field intensity and resistance of each of the pads 230 may be calculated using the signal image SI of FIG. 6A. The shape and position of each of the pads 230 may be determined using the optical image PI of FIG. 6B and coordinates corresponding thereto may be calculated. Since the signal image SI and the optical image PI may be measured through only focus adjustment with a single light generated by the optical unit 140 (see FIG. 1), which is a single optical unit, the matching between position data and signal data of the pad 230 may be easily processed.

Figure 7A:
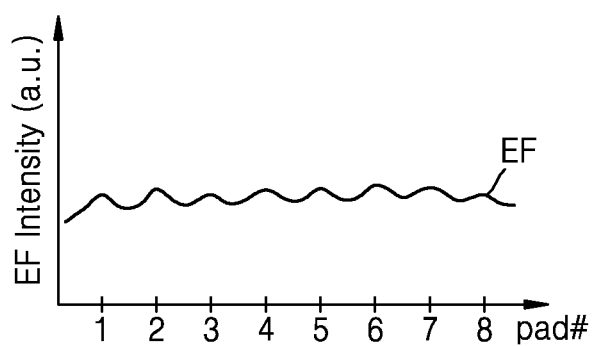
FIGS. 7A and 7B are graphs for explaining testing the presence or absence of an abnormality in a wiring by using the wiring circuit test apparatus of FIG. 1.
Figure 7B:
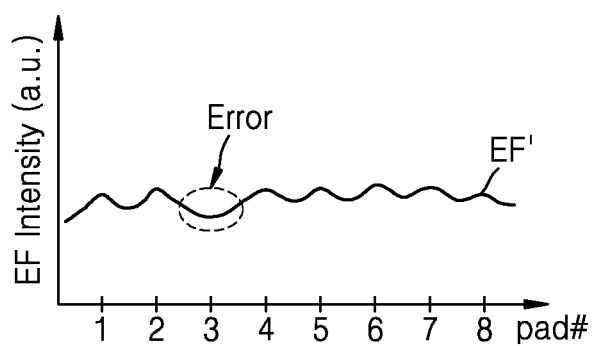

FIGS. 7A and 7B are graphs for explaining testing the presence or absence of an abnormality in a wiring by using the wiring circuit test apparatus 10 of FIG. 1.

The horizontal axis of each of the graphs represents numbers of pads arranged in one direction, and the vertical axis of each of the graphs represents an arbitrary unit indicating the intensity of a detected electric field. For convenience of understanding, the wiring circuit test apparatus 10 of FIG. 1 is described together with the graphs.

The graph of FIG. 7A shows an electric field EF in a state in which all of the wirings 220 of the circuit substrate 200 are normal, and the graph of FIG. 7B shows an electric field EF' in a state in which some of the wirings 220 of the circuit substrate 200 are abnormal.

When the circuit substrate 200 is normal, each of the pads 230 may emit an electric field EF applied through a corresponding wiring 220 to the outside. Accordingly, as shown in FIG. 7A, the intensity of the electric field EF may be relatively high at a position corresponding to each of the pads 230 and may be relatively low at a position corresponding to each of areas between the pads 230. FIG. 7A shows a case where the wirings 220 of the pads 230 are similar in structure. However, when the structures of the wirings 220 of the pads 230 are different from each other, another type of graph may appear.

When the circuit substrate 200 is abnormal, the intensity of the electric field EF may be low at a position corresponding to a third pad 230, as indicated by a dashed circle Error in FIG. 7B. The fact that the electric field EF' is low even though the third pad 230 is present may mean that a wiring 220 connected to the third pad 230 has been shorted or opened. Thus, in this case, in the circuit substrate 200, a portion of the wiring 220 connected to the third pad 230 may be in an abnormal state. In addition, since the position of each of the pads 230 may be accurately specified based on the optical image of the circuit substrate 200, the third pad 230 connected to the abnormal wiring 220 may be quickly detected.

Figure 8A:
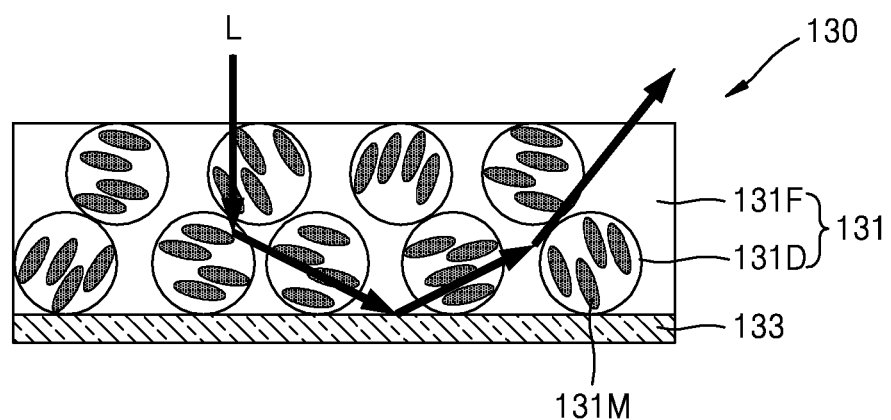
FIGS. 8A and 8B are cross-sectional views illustrating an operation of an optical sensor in the wiring circuit test apparatus of FIG. 1, according to an exemplary embodiment of the inventive concept.
Figure 8B:
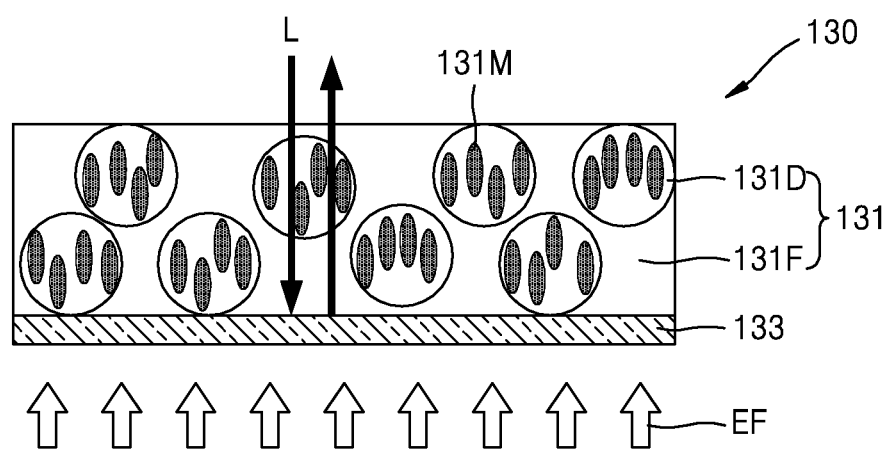

FIGS. 8A and 8B are cross-sectional views illustrating an operation of an optical sensor 130 in the wiring circuit test apparatus 10 of FIG. 1, according to an exemplary embodiment of the inventive concept.

Referring to FIGS. 8A and 8B, the optical sensor 130 may include an optical substrate 131 and a patterned reflective layer 133, and the optical substrate 131 may include a composite material layer.

The patterned reflective layer 133 may partially reflect incident light L. A reflective region of the patterned reflective layer 133 may include a dielectric mirror film or a cholesteric liquid crystal (CLC) polymer.

The optical substrate 131 may include a composite material layer including a polymer film 131F and a liquid crystal droplet 131D. For example, the optical substrate 131 may include a polymer dispersed liquid crystal. Accordingly, the optical substrate 131 may have a structure in which a plurality of liquid crystal droplets 131D are dispersed and arranged in the polymer film 131F. A plurality of liquid crystal molecules 131M may be included in each of the liquid crystal droplets 131I).

In a state in which an electric field EF is not applied to the optical sensor 130 as shown in FIG. 8A, the liquid crystal molecules 131M in each of the liquid crystal droplets 131D may be disorderly arranged. However, the liquid crystal molecules 131M are not completely disorderly arranged due to the characteristic of the liquid crystal, so they may have some degree of regularity. Accordingly, the incident light L may be scattered by the disorderly arranged liquid crystal molecules 131M, and thus, the optical substrate 131 may be seen to be opaque.

In a state in which an electric field EF is applied to the optical sensor 130 as shown in FIG. 8B, the liquid crystal molecules 131M in the liquid crystal droplet 131D may be aligned in the direction of the electric field EF. Accordingly, the incident light L may pass through the aligned liquid crystal molecules 131M, reach the patterned reflective layer 133 and be reflected by a reflective area, such that the optical substrate 131 may be seen to be transparent.

FIG. 8B illustrates a state in which a strong electric field EF is applied to the entire area of the optical sensor 130 and all of the liquid crystal molecules 131M are aligned in the direction of the electric field EF. However, in some exemplary embodiments of the inventive concept, the strong electric field EF may not be applied over the entire area. In this case, liquid crystal molecules 131M in an area where the intensity of the electric field EF is weak may be incompletely aligned in the direction of the electric field EF, and the reflectance in that area may be lowered.

Figure 9A:
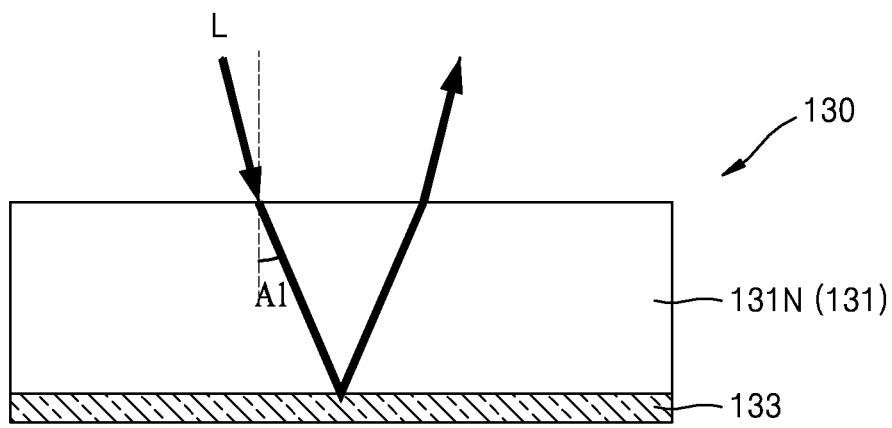
FIGS. 9A and 9B are cross-sectional views illustrating an operation of an optical sensor in the wiring circuit test apparatus of FIG. 1, according to another exemplary embodiment of the inventive concept.
Figure 9B:
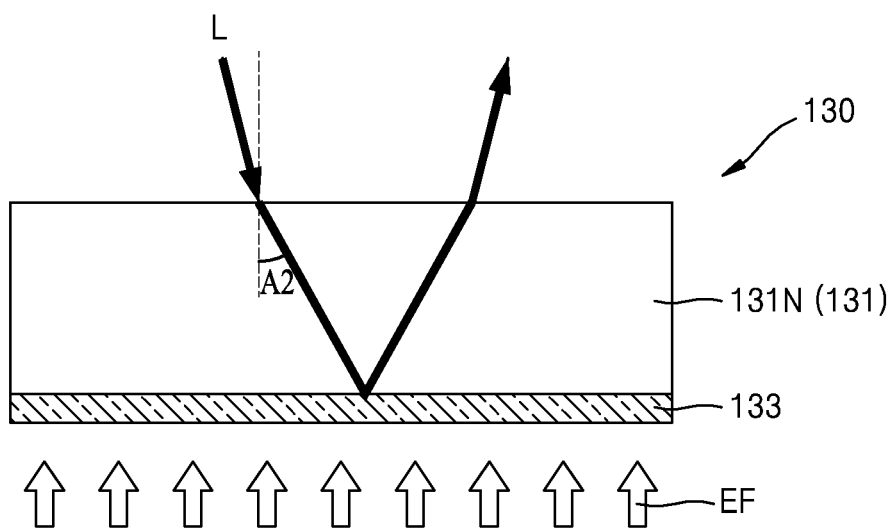

FIGS. 9A and 9B are cross-sectional views illustrating an operation of an optical sensor 130 in the wiring circuit test apparatus 10 of FIG. 1, according to another exemplary embodiment of the inventive concept.

Referring to FIGS. 9A and 9B, the optical sensor 130 may include an optical substrate 131 and a patterned reflective layer 133, and the optical substrate 131 may include a refractive index conversion layer 131N.

The refractive index of the refractive index conversion layer 131N constituting the optical substrate 131 may be changed by the application of an electric field EF. A change in the refractive index may change the refraction angle of incident light L. Furthermore, the change in the refractive index may change the phase of the incident light L. The refractive index conversion layer 131N may include, for example, monocrystalline silicon.

In a state in which an electric field EF is not applied to the optical sensor 130 as shown in FIG. 9A, the incident light L may be refracted at a first refraction angle A1 at the boundary of the refractive index conversion layer 131N and reflected by the patterned reflective layer 133, and thus, reflected light may be emitted from the optical sensor 130.

In a state in which an electric field EF is applied to the optical sensor 130 as shown in FIG. 9B, the refractive index of the refractive index conversion layer 131N may be changed and the incident light L may be refracted at a second refraction angle A2 at the boundary of the refractive index conversion layer 131N and reflected by the patterned reflective layer 133, and thus, reflected light may be emitted from the optical sensor 130. Thus, by detecting the reflected light emitted from the optical sensor 130 with respect to the incident light L incident on the optical sensor 130 at a set incident angle and converting the detected light into an electric signal, it is possible to detect the presence or absence of an electric field EF at a corresponding position or the intensity of the electric field EF.

FIGS. 10, 11, 12 and 13 are configuration diagrams illustrating wiring circuit test apparatuses 20, 30, 40, and 50 according to other exemplary embodiments of the inventive concept.

Most of the components of the wiring circuit test apparatuses 20, 30, 40, and 50 and the functions of the components are substantially the same as or similar to those described above with reference to FIG. 1. Thus, for convenience of description, differences from the wiring circuit test apparatus 10 (see FIG. 1) are mainly described.

Figure 10:
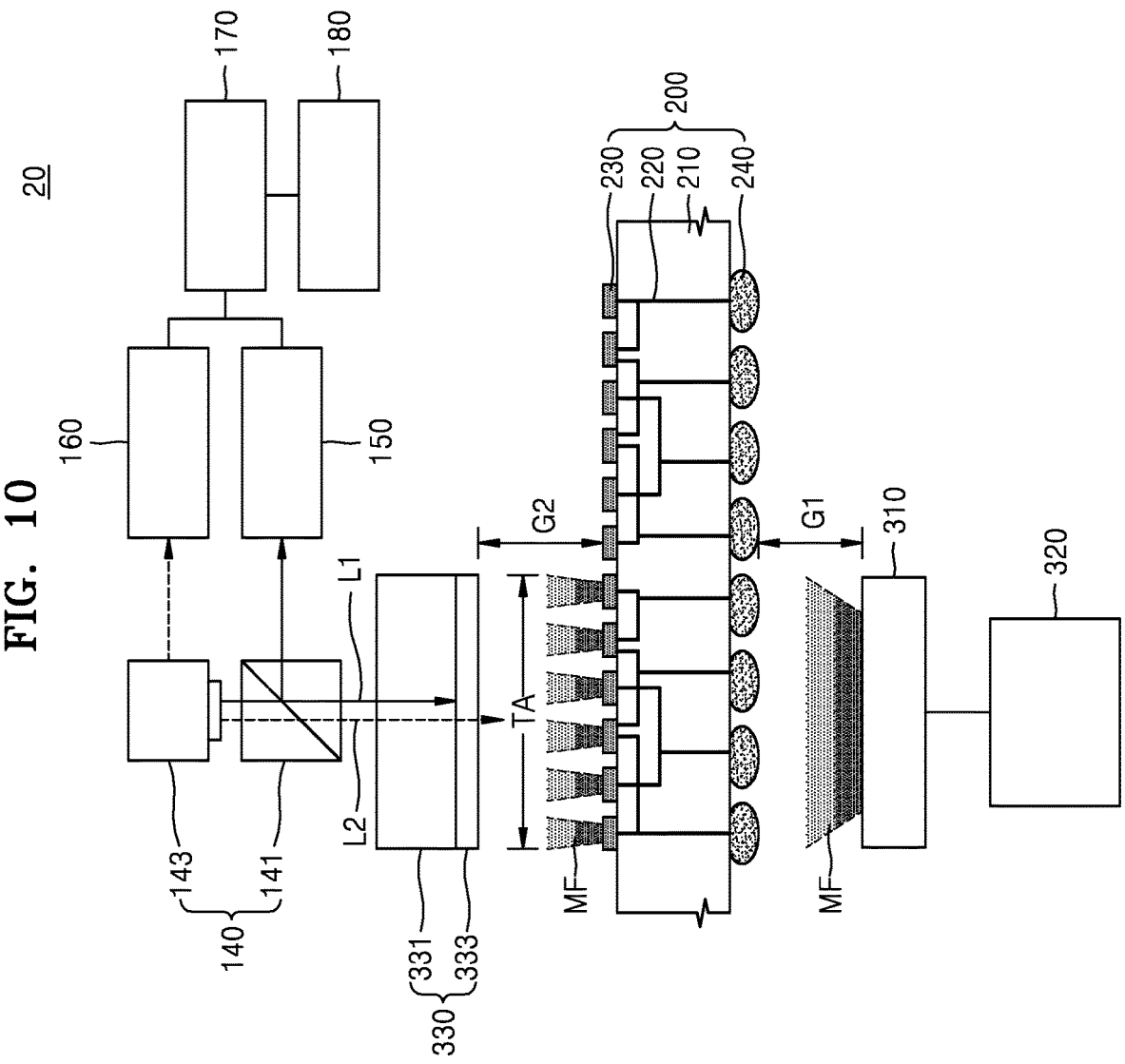
FIGS. 10, 11, 12 and 13 are diagrams illustrating wiring circuit test apparatuses according to other exemplary embodiments of the inventive concept.

Referring to FIG. 10, the wiring circuit test apparatus 20 is an apparatus for testing the presence or absence of an abnormality in a wiring 220 included in a circuit substrate 200 in a non-contact manner using a magnetic field MF. The wiring circuit test apparatus 20 may include an electrode 310, a magnetic signal generator 320, an optical sensor 330, an optical unit 140, a signal processor 150, an image processor 160, a determination unit 170, and a controller 180.

The electrode 310 may be connected to the magnetic signal generator 320 and may apply a magnetic field MF to the circuit substrate 200.

The electrode 310 may be located under the circuit substrate 200. However, the position of the electrode 310 is not limited thereto. Although the magnetic field MF generated by the electrode 310 is indicated by hatching for convenience of understanding, the actual form of the magnetic field MF may be different.

The magnetic signal generator 320 may generate a magnetic signal for magnetic field generation. For example, the magnetic signal generator 320 may generate a magnetic signal by using a solenoid coil, and the generated magnetic signal may be applied to the circuit substrate 200 as the magnetic field MF through the electrode 310 and thus a magnetic field MF may be generated in the circuit substrate 200. In exemplary embodiments of the inventive concept, the magnetic signal generator 320 may be integrated with the electrode 310.

The optical sensor 330 may detect the magnetic field MF emitted from the circuit substrate 200. In exemplary embodiments of the inventive concept, the optical sensor 330 may include a sensor using magneto-optic crystals. However, the type of the optical sensor 330 is not limited thereto. For example, all types of optical sensors capable of effectively detecting the magnetic field MF may be applied to the wiring circuit test apparatus 20.

The detection of the magnetic field MF by the optical sensor 330 may correspond to detection of a signal providing information on magnetic field intensity rather than direct detection of the magnetic field intensity. For example, the optical sensor 330 may detect a magnetic signal or an optical signal, and the detected magnetic signal or optical signal may include information on magnetic field intensity.

Figure 11:
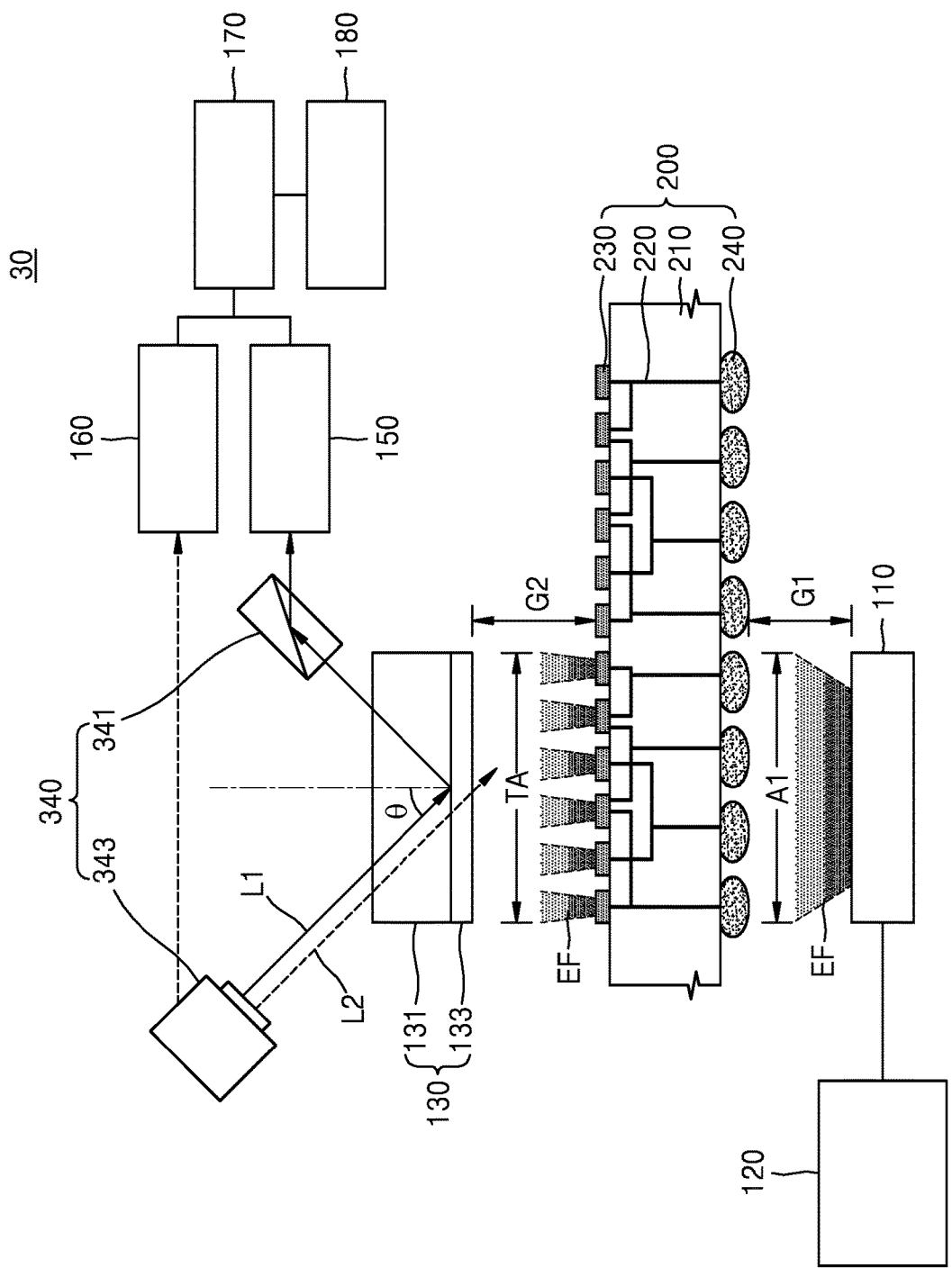

Referring to FIG. 11, the wiring circuit test apparatus 30 is an apparatus for testing the presence or absence of an abnormality in a wiring 220 included in a circuit substrate 200 in a non-contact manner using an electric field EF. The wiring circuit test apparatus 30 may include an electrode 110, an electric signal generator 120, an optical sensor 130, an optical unit 340, a signal processor 150, an image processor 160, a determination unit 170, and a controller 180.

The optical unit 340 may include an optical device 341 and a light source device 343. Lights L1 and L2 generated by the light source device 343 may be incident on the optical sensor 130, and the light L1 reflected from the optical sensor 130 may be incident on the signal processor 150 via the optical device 341.

The optical device 341 and the light source device 343 may be spaced apart from each other and the light L1 emitted from the light source device 343 may form a certain angle θ from the imaginary normal at the center of the optical sensor 130. The light source device 343 may generate the lights L1 and L2 and may cause the generated light L1 to enter the optical sensor 330 at the certain angle θ. The light source device 343 may include a function of capturing an optical image. For example, the light source device 343 may include an image pickup unit. The image pickup unit may be integrated with the light source device 343 or be adjacent to the light source device 343.

Figure 12:
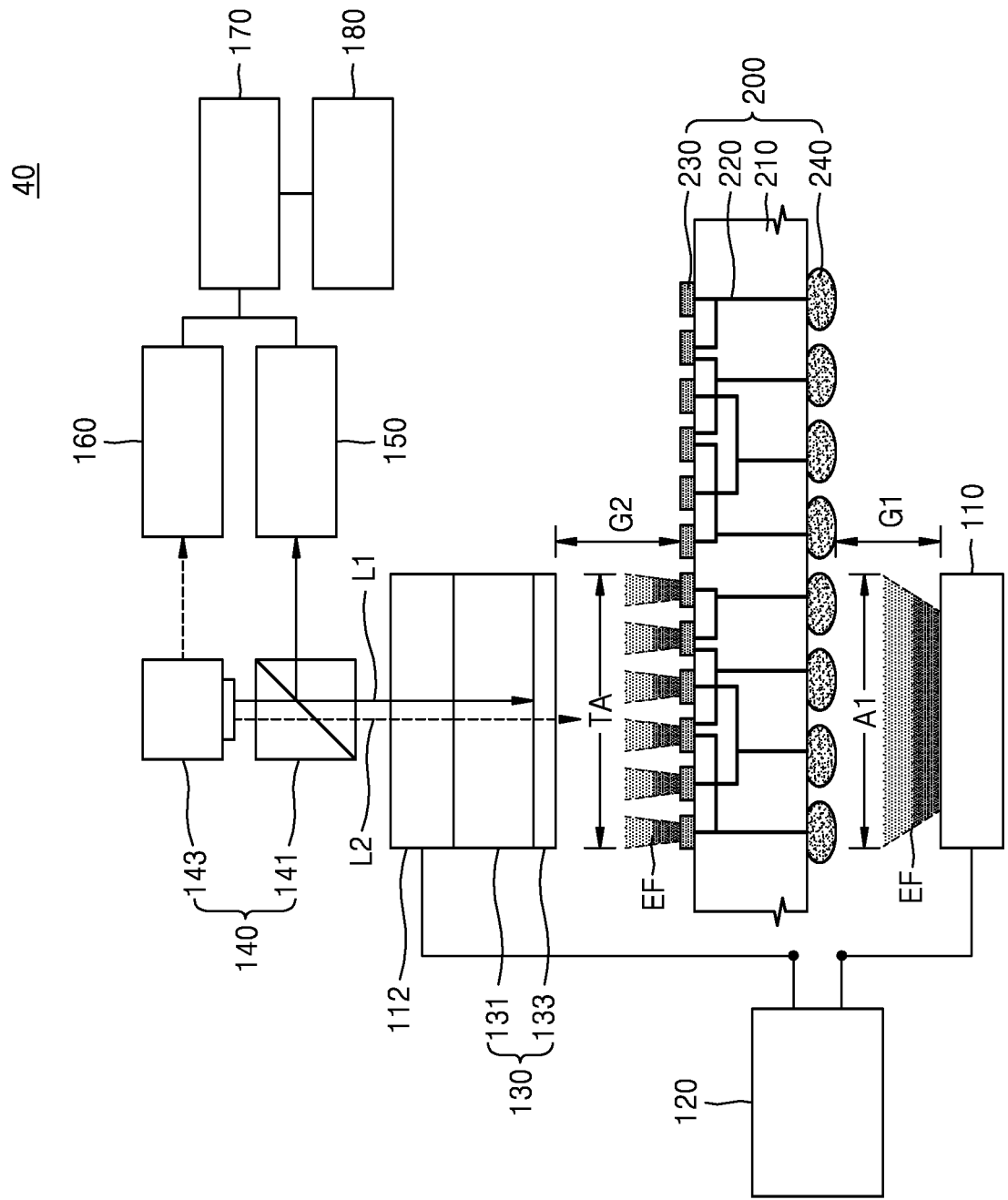

Referring to FIG. 12, the wiring circuit test apparatus 40 is an apparatus for testing the presence or absence of an abnormality in a wiring 220 included in a circuit substrate 200 in a non-contact manner using an electric field EF. The wiring circuit test apparatus 40 may include a first electrode 110, a second electrode 112, an electric signal generator 120, an optical sensor 130, an optical unit 140, a signal processor 150, an image processor 160, a determination unit 170, and a controller 180.

The first and second electrodes 110 and 112 may be electrically connected to the electric signal generator 120 and apply an electrical signal to the circuit substrate 200. The first and second electrodes 110 and 112 may include a metal having excellent electrical conductivity. In some exemplary embodiments of the inventive concept, the second electrode 112 may be a transparent electrode.

In the wiring circuit test apparatus 40, the first electrode 110 may be located under the circuit substrate 200 and the second electrode 112 may be located above the circuit substrate 200. However, the positions of the first and second electrodes 110 and 112 are not limited thereto.

Each of the first and second electrodes 110 and 112 may have a flat plate shape. For example, the first electrode 110 may have a flat plate shape corresponding to the lower surface of the circuit substrate 200, and the second electrode 112 may have a flat plate shape corresponding to a test area TA of the upper surface of the circuit substrate 200. The first and second electrodes 110 and 112 may have the same shape or may have different shapes.

Each of the first and second electrodes 110 and 112 may be spaced apart from the circuit substrate 200. For example, the first electrode 110 may be spaced apart from the circuit substrate 200 by a gap G1. In exemplary embodiments of the inventive concept, the second electrode 112 may be integrated with the optical sensor 130. In this case, the integrated structure may be spaced apart from the circuit substrate 200 by a gap G2.

The electric signal generator 120 may generate an electric signal for electric signal generation. For example, the electric signal generator 120 may generate an electric signal and apply the electric signal to the circuit substrate 200 through the first and second electrodes 110 and 112, and thus, an electric field EF may be emitted from the circuit substrate 200.

In some exemplary embodiments of the inventive concept, the first electrode 110 may be connected to a positive terminal of the electric signal generator 120 and the second electrode 112 may be connected to a negative terminal of the electric signal generator 120. Accordingly, the direction of the electric field EF may be directed from the first electrode 110 to the second electrode 112. To reverse the direction of the electric field EF, the connections of the first and second electrodes 110 and 112 to the terminals of the electric signal generator 120 may be switched.

Figure 13:
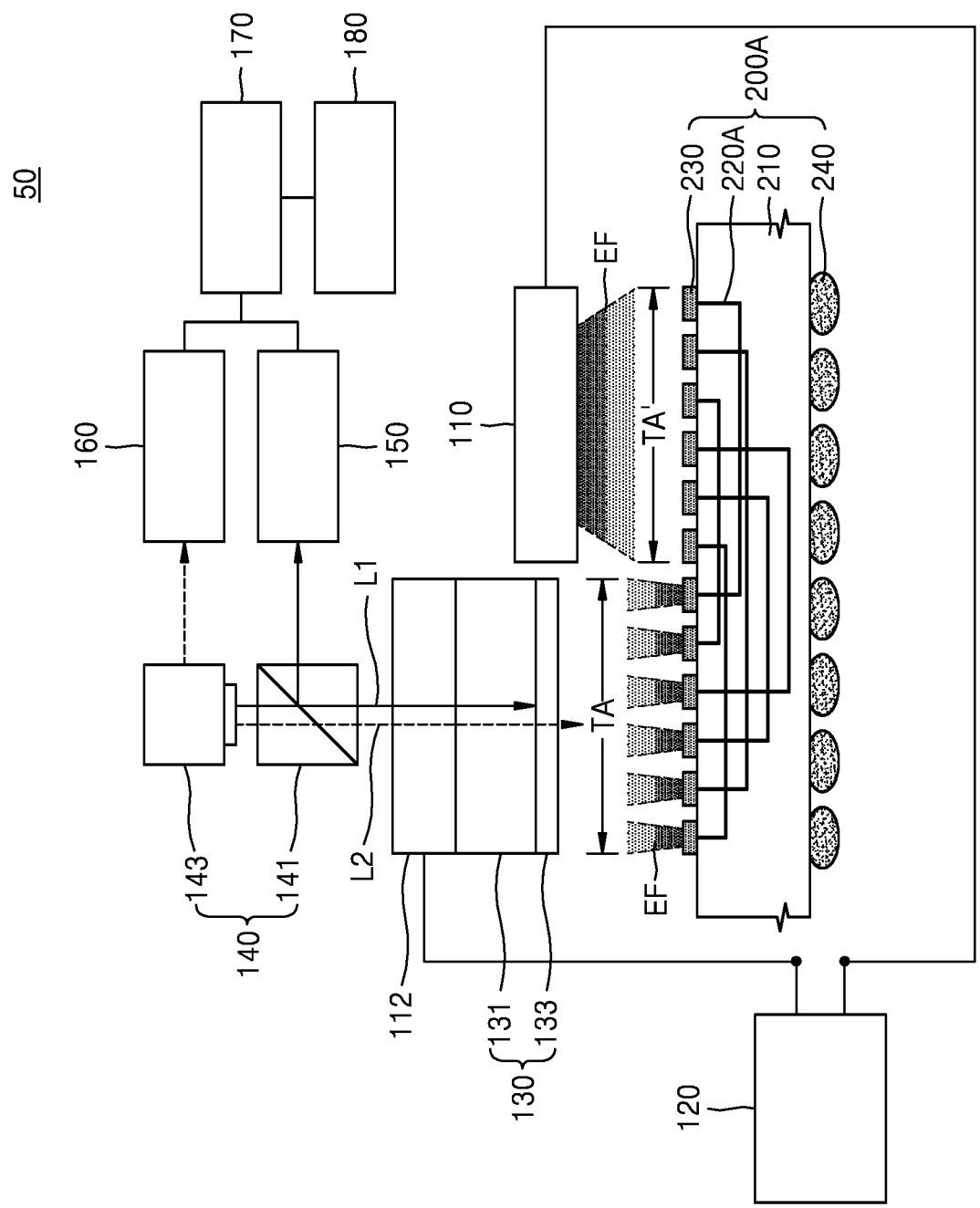

Referring to FIG. 13, the wiring circuit test apparatus 50 is an apparatus for testing the presence or absence of an abnormality in a wiring 220A included in a circuit substrate 200A in a non-contact manner using an electric field EF. The wiring circuit test apparatus 50 may include a first electrode 110, a second electrode 112, an electric signal generator 120, an optical sensor 130, an optical unit 140, a signal processor 150, an image processor 160, a determination unit 170, and a controller 180.

The arrangement position of the first electrode 110 in the wiring circuit test apparatus 50 may be different from that of the first electrode 110 in the wiring circuit test apparatus 40 of FIG. 12. For example, in the wiring circuit test apparatus 50, the first electrode 110 may be located above the circuit substrate 200A. In other words, the first and second electrodes 110 and 112 may be located above the same side of the circuit substrate 200A.

The circuit substrate 200A has a structure in which a pad 230 in a test area TA' where the first electrode 110 is located and a pad 230 in a test area TA where the second electrode 112 is located are electrically connected to each other via the wiring 220A. As such, when pads 230 are electrically connected to each other through the wiring 220A, the first and second electrodes 110 and 112 may be placed above the same side of the circuit substrate 200A to perform a test.

Figure 14A:
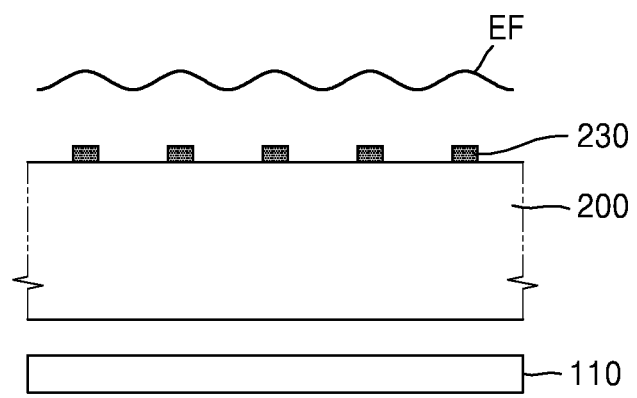
FIGS. 14A and 14B are cross-sectional views illustrating forming signals by using first and second electrodes in the wiring circuit test apparatuses of FIGS. 12 and 13.
Figure 14B:
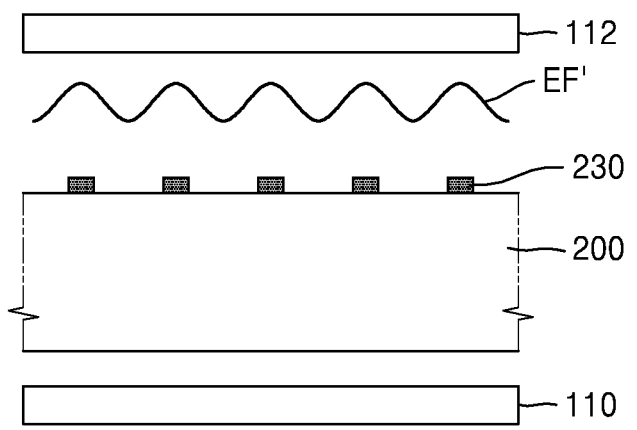

FIGS. 14A and 14B are cross-sectional views illustrating forming signals by using first and second electrodes in the wiring circuit test apparatuses 40 and 50 of FIGS. 12 and 13.

Referring to FIGS. 14A and 14B, FIG. 14A illustrates a state in which an electric field EF is applied to the circuit substrate 200 and the second electrode 112 is not located above the circuit substrate 200, and FIG. 14B illustrates a state in which an electric field EF' is applied to the circuit substrate 200 and the second electrode 112 in the form of a flat plate is located above the circuit substrate 200.

The electric fields EF and EF' may be applied to the lower surface of the circuit substrate 200 by using the first electrode 110. Alternatively, the electric field EF or EF' may be applied to the upper surface of the circuit substrate 200 by using the first electrode 110.

When the electric field EF or EF' is applied to the circuit substrate 200, the intensity of the electric field EF or EF' may be relatively high at a position corresponding to each of the pads 230 and the intensity of the electric field EF or EF' may be relatively low at a position corresponding to each of areas between the pads 230. In addition, the shape of the electric field EF or EF' may be different in a case where the second electrode 112 is located above the circuit substrate 200 and a case where the second electrode 112 is not located above the circuit substrate 200.

For example, when the second electrode 112 is not present as shown FIG. 14A, a difference between the intensity of an electric field EF of an area corresponding to the pads 230 and the intensity of an electric field EF of an area between the pads 230 may not be large. Accordingly, a radiation pattern of the total electric field EF may have a smooth curved shape with a small difference in position between a crest and a trough (or a peak and a valley).

In contrast, when the second electrode 112 is present as shown in FIG. 14B, a difference between the intensity of an electric field EF' in an area corresponding to the pads 230 and the intensity of an electric field EF' in an area between the pads 230 may be large. This is because the second electrode 112 increases a potential difference and amplifies the intensity of the electric field EF' in the area corresponding to the pads 230. Thus, a radiation pattern of the total electric field EF' may have a sharp curved shape with a large difference in position between a crest and a trough.

Figure 15:
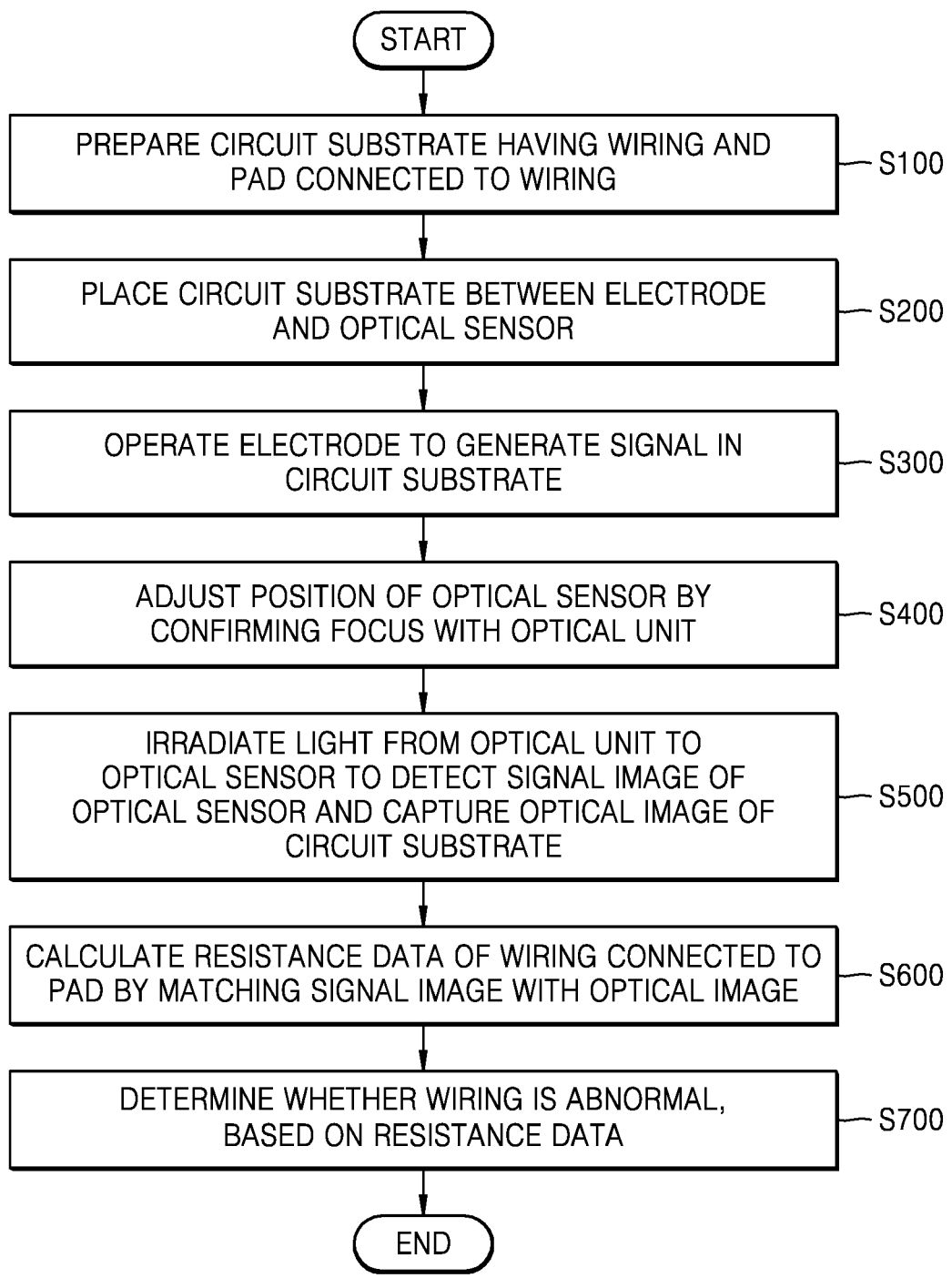
FIG. 15 is a flowchart of a wiring circuit test method according to an exemplary embodiment of the inventive concept.

FIG. 15 is a flowchart of a method of testing a wiring circuit (hereinafter, referred to as a wiring circuit test method), according to an exemplary embodiment of the inventive concept.

Referring to FIG. 15, the wiring circuit test method may include a first operation S100 of preparing a circuit substrate having a wiring and a pad connected to the wiring, a second operation S200 of placing the circuit substrate between an electrode and an optical sensor, a third operation S300 of operating the electrode to generate a signal in the circuit substrate, and a fourth operation S400 of adjusting the position of the optical sensor by confirming a focus with an optical unit. Still referring to FIG. 15, the wiring circuit test method may include a fifth operation S500 of irradiating light from the optical unit to the optical sensor to detect a signal image of the optical sensor and capturing an optical image of the circuit substrate, a sixth operation S600 of calculating resistance data of the wiring connected to the pad by matching the signal image with the optical image, and a seventh operation S700 of determining whether or not the wiring is abnormal, based on the resistance data.

After the first to seventh operations S100 to S700, the presence or absence of the abnormality in the circuit substrate may be determined by a determination unit, based on design data of the circuit substrate and the resistance data. For example, the design data of the circuit substrate, in other words, data on the positions or connection structures of wirings, pads, and connection terminals, may be input to the determination unit in advance. In addition, a reference electric field graph of the circuit substrate and/or a reference resistance of wirings may be input to the determination unit. Then, a signal image of a tested circuit substrate is input to a signal processor, an optical image is input to an image processor, and the determination unit determines whether or not the circuit substrate is normal.

In the wiring circuit test method, the presence or absence of an abnormality in a circuit substrate may be determined by detecting an electric field only in a few test areas set on the circuit substrate, or by detecting an electric field with respect to the entire circuit substrate.

For example, in the wiring circuit test method, testing of the circuit substrate may be performed at a wafer level. In other words, a single wafer may contain several tens to several hundreds of circuit substrates, and the detection of an electric field by the wiring circuit test method may be performed on each of the circuit substrates to determine whether there is an abnormality in each circuit substrate.

Figure 16:
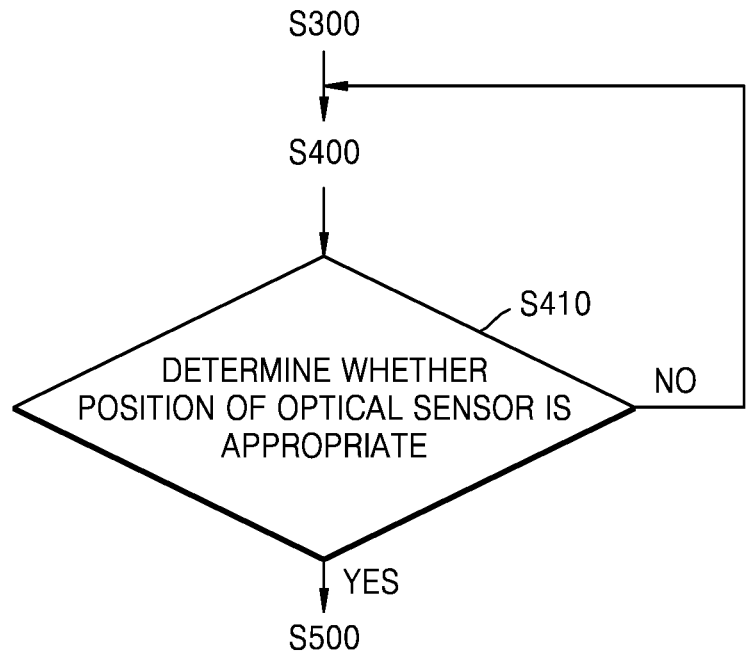
FIGS. 16, 17 and 18 are flowcharts including additional operations in the wiring circuit test method of FIG. 15.
Figure 17:
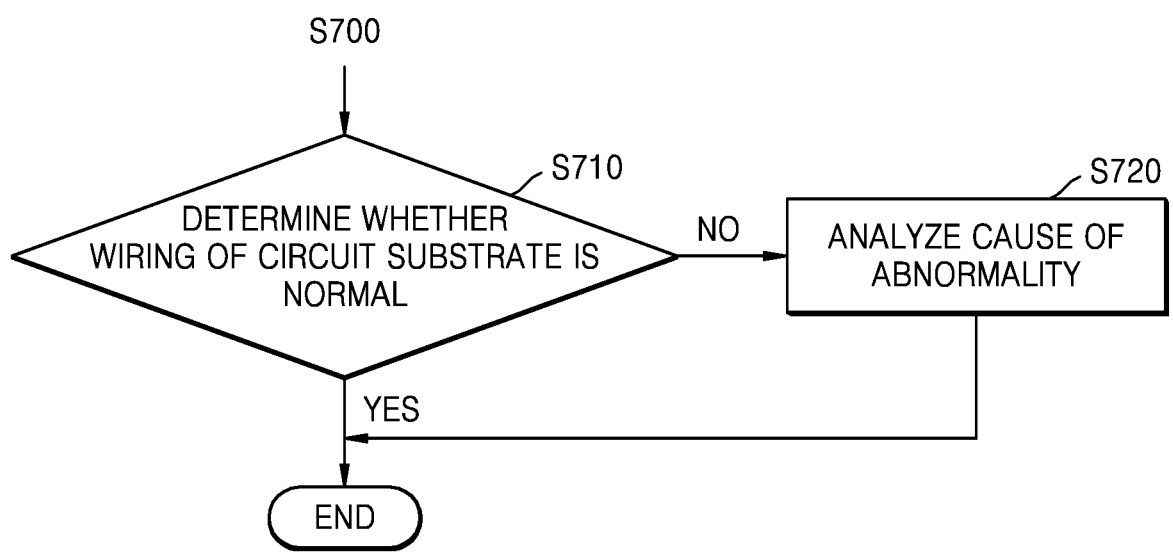
Figure 18:
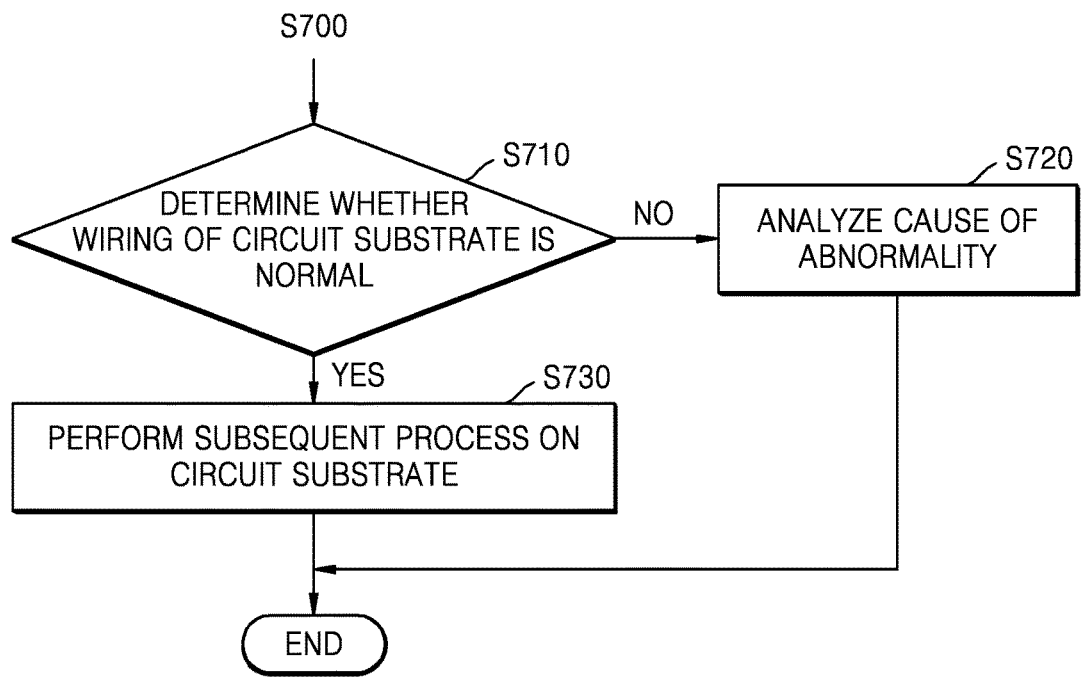

FIGS. 16 to 18 are flowcharts including additional operations in the wiring circuit test method of FIG. 15.

Referring to FIG. 16, the wiring circuit test method may further include operation S410 of determining whether the position of the optical sensor is appropriate. If it is determined in the operation S410 that the position of the optical sensor is appropriate (YES), the fifth operation S500 is performed. Otherwise, if it is determined in the operation S410 that the position of the optical sensor is not appropriate (NO), a controller may adjust a distance between the optical sensor and the circuit substrate and a tilt angle of the optical sensor. In the latter case, the operation S410 may be repeated.

The controller may adjust the position and angle of the optical sensor to obtain an accurate signal image and an accurate optical image by adjusting the focuses of the optical sensor and the circuit substrate by the optical unit.

Referring to FIG. 17, the wiring circuit test method may further include operation S710 of determining whether a wiring of the circuit substrate is normal. If it is determined in the operation S710 that the wiring of the circuit substrate is normal (YES), the wiring circuit test method is terminated. Otherwise, if it is determined in the operation S710 that the wiring of the circuit substrate is abnormal (NO), operation S720 of analyzing the cause of the abnormality may be performed, and then, the wiring circuit test method is terminated.

The wiring circuit test method may also be used in a failure analysis facility. The failure analysis facility may precisely analyze which pad or which wiring has a problem and/or which part of the wiring has a problem. Thus, in the wiring circuit test method, abnormal pads and/or wirings may be detected through the detection of an electric field and thus the cause of defects may be precisely analyzed for each wiring.

Referring to FIG. 18, the wiring circuit test method may further include operation S710 of determining whether a wiring of the circuit substrate is normal. If it is determined in the operation S710 that the wiring of the circuit substrate is normal (YES), operation S730 of performing a subsequent process on the circuit substrate may be performed. Otherwise, if it is determined in the operation S710 that the wiring of the circuit substrate is abnormal (NO), operation S720 of analyzing the cause of the abnormality may be performed, and then the wiring circuit test method is terminated.

The subsequent process may include, for example, a process of forming a package structure by stacking semiconductor chips on the circuit substrate and molding the semiconductor chips with a sealing material and a process of cutting the package structure into individual semiconductor packages.

A circuit substrate with an abnormal wiring may be discarded. However, when the circuit substrate with an abnormal wiring is repairable, a repair process may be performed on the circuit substrate.

Figure 19:
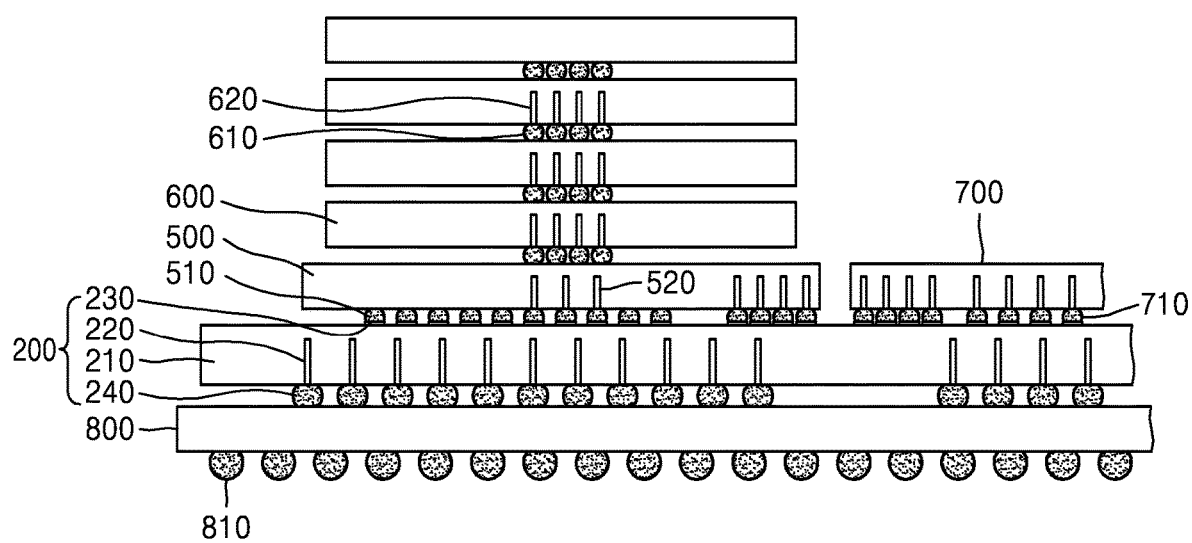
FIG. 19 is a cross-sectional view of a semiconductor package tested through a wiring circuit test apparatus according to an exemplary embodiment of the inventive concept.

FIG. 19 is a cross-sectional view of a semiconductor package tested through a wiring circuit test apparatus according to an exemplary embodiment of the inventive concept.

Referring to FIG. 19, a semiconductor package 1000 including a circuit substrate 200 tested through the wiring circuit test apparatus 10, 20, 30, 40, or 50 according to the exemplary embodiments of the inventive concept may include semiconductor chips 500, 600, and 700, and a package substrate 800.

The semiconductor chips 500, 600, and 700 may include memory chips and/or logic chips. For example, the semiconductor chips 500, 600, and 700 may include memory chips of the same type, or one of the semiconductor chips 500, 600, and 700 may include a memory chip and the other ones of the semiconductor chips 500, 600, and 700 may include logic chips.

The memory chip may be a volatile or non-volatile memory chip. The volatile memory chip may include an existing volatile memory chip, such as dynamic random access memory (DRAM), static RAM (SRAM), or thyristor RAM (TRAM), and a volatile memory chip currently under development. The non-volatile memory chip may include an existing non-volatile memory chip, such as a flash memory, magnetic RAM (MRAM), spin-transfer torque MRAM (STT-MRAM), ferroelectric RAM (FRAM), phase change RAM (PRAM), or resistive RAM (RRAM), and a non-volatile memory chip currently under development.

The logic chip may be implemented, for example, as a microprocessor, a graphics processor, a signal processor, a network processor, a chipset, an audio codec, a video codec, an application processor, or a system on chip, but is not limited thereto.

The semiconductor chips 500, 600, and 700 may be stacked on the circuit substrate 200 through fine bumps 510, 610, and 710. The semiconductor chips 500 and 600 may be electrically connected to each other through the fine bumps 510 and 610, through electrodes 520 and 620, and internal wirings.

The semiconductor chips 500, 600 and 700 may be stacked on the package substrate 800 by using the circuit substrate 200 tested through the wiring circuit test apparatus 10, 20, 30, 40, or 50 according to the exemplary embodiments of the inventive concept. The circuit substrate 200 may include a substrate 210, wirings 220, pads 230, and connection terminals 240 and electrically connect the semiconductor chips 500, 600, and 700 to the package substrate 800.

The package substrate 800 may include external connection terminals 810 such as bumps or solder balls at the bottom. Accordingly, the semiconductor package 1000 may be mounted on another external device via the external connection terminals 810.

While the inventive concept has been particularly shown and described with reference to exemplary embodiments thereof, it will be understood that various changes in form and details may be made thereto without departing from the spirit and scope of the inventive concept as defined by the following claims.

What is claimed is:

1. An apparatus for testing a wiring circuit, the apparatus comprising:
   a circuit substrate having wirings formed in the circuit substrate and pads formed on an upper surface of the circuit substrate and connected to the wirings;
   an electrode located below a lower surface of the circuit substrate;
   an optical sensor located above the upper surface of the circuit substrate and configured to detect a signal emitted from the upper surface of the circuit substrate; and
   an optical unit located above the optical sensor and configured to irradiate light,
   wherein the optical sensor comprises:
   an optical substrate whose optical characteristics are changed by the signal emitted from the upper surface of the circuit substrate; and a patterned reflective layer located on a surface of the optical substrate facing the circuit substrate, the patterned reflective layer having a first region for reflecting light incident on the optical substrate and a second region for transmitting the light incident on the optical substrate, wherein the first and second regions of the patterned reflective layer are provided at the lowermost portion of the optical sensor.

2. The apparatus of claim 1, wherein the first region comprises a plurality of first lines extending in a first direction and spaced apart from each other in a second direction orthogonal to the first direction, and the second region comprises a plurality of second lines extending in the first direction and spaced apart from each other in the second direction, wherein the first lines and the second lines are alternately and repeatedly arranged.

3. The apparatus of claim 1, wherein the first region is arranged to cross a first direction and a second direction which are orthogonal to each other and the second region is arranged in an area where the first region is not formed.

4. The apparatus of claim 1, wherein at least one of the pads overlaps the first and second regions.

5. The apparatus of claim 1, wherein the signal emitted from the upper surface of the circuit substrate comprises an electric field and the optical sensor comprises an electro-optical sensor.

6. The apparatus of claim 1, a wherein the signal emitted from the upper surface of the circuit substrate comprises a magnetic field and the optical sensor comprises a magneto-optical sensor.

7. The apparatus of claim 1, wherein each of the electrode and the optical sensor is spaced apart from the circuit substrate.

8. The apparatus of claim 1, further comprising:
a signal processor configured to analyze the light reflected from the first region and calculate resistance data of the wirings; and
an image processor configured to detect position data of the pads by using the light transmitted through the second region.

9. The apparatus of claim 1, further comprising a controller configured to adjust a gap between the optical sensor and the circuit substrate and a tilt angle of the optical sensor.

10. The apparatus of claim 1, wherein the light irradiated to the optical substrate has an incident angle.

11. An apparatus for testing a wiring circuit, the apparatus comprising:
an electric signal generator figured to generate an electric signal for generating an electric field;
a circuit substrate having an upper surface and a lower surface, the circuit substrate including wirings formed therein;
a first electrode located on a first portion of the circuit substrate;
a second electrode located on a second portion of the circuit substrate;
an optical sensor configured to detect an electric field emitted from an upper surface of the circuit substrate; and
an optical unit located on the optical sensor and configured to irradiate light, wherein the optical sensor comprises:
an optical substrate whose optical characteristics are changed by the electric field emitted from the upper surface of the circuit substrate; and
a patterned reflective layer located on a surface of the optical substrate facing the circuit substrate, the patterned reflective layer having a first region for reflecting light incident on the optical substrate and a second region for transmitting the light incident on the optical substrate, wherein the patterned reflective layer has a stripe pattern formed by the first and second regions, or wherein the patterned reflective layer has a mesh pattern formed by the first and second regions.

12. The apparatus of claim 11, wherein the second electrode is located between the optical sensor and the optical unit, wherein the second electrode comprises a transparent electrode.

13. The apparatus of claim 11, wherein the first and second electrodes are located together on the upper or lower surface of the circuit substrate, or wherein the first and second electrodes are located with the circuit substrate therebetween.

14. The apparatus of claim 11, wherein pads electrically connected to the wirings are located on the upper surface of the circuit substrate.

15. An apparatus for testing a wiring circuit, the apparatus comprising:
a circuit substrate having wirings formed in the circuit substrate and pads formed on a first surface of the circuit substrate and connected to the wirings;
an electrode spaced apart from a second surface of the circuit substrate and generating a first electric field towards the second surface of the circuit substrate; and
an optical sensor spaced apart from the first surface of the circuit substrate and configured to detect a second electric field emitted from the first surface of the circuit substrate, wherein the optical sensor comprises:
an optical substrate; and
a reflective layer disposed on the optical substrate and facing the circuit substrate, the reflective layer having a first region for reflecting light incident on the optical substrate and a second region for transmitting the light incident on the optical substrate, wherein a signal image is obtained using the light reflected from the first region and an optical image is obtained using the light incident on the circuit substrate through the second region.

16. The apparatus of claim 15, further comprising a controller configured to adjust a gap between the optical sensor and the circuit substrate and a tilt angle of the optical sensor.

17. The apparatus of claim 16, further comprising an optical unit located above the optical sensor and configured to irradiate light.

18. The apparatus of claim 17, wherein the gap and the tilt angle between the circuit substrate and the optical sensor is adjusted through only a focus adjustment of the optical unit without a position sensor.

* * * * *